(12) United States Patent
Kawashima

(10) Patent No.: US 7,947,433 B2
(45) Date of Patent: May 24, 2011

(54) EXPOSURE METHOD

(75) Inventor: Miyoko Kawashima, Haga-gun (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/539,963

(22) Filed: Aug. 12, 2009

(65) Prior Publication Data

US 2010/0003620 A1    Jan. 7, 2010

Related U.S. Application Data

(63) Continuation of application No. 11/549,279, filed on Oct. 13, 2006, now Pat. No. 7,592,130.

(30) Foreign Application Priority Data

Oct. 14, 2005    (JP) ................................ 2005-300662

(51) Int. Cl.
    *G03F 7/26* (2006.01)
(52) U.S. Cl. ............................... 430/322; 430/22; 430/5
(58) Field of Classification Search .................. 430/311, 430/5, 22, 322
    See application file for complete search history.

(56) References Cited

U.S. PATENT DOCUMENTS

| 7,359,033 B2 | 4/2008 | Yamazoe |
| 2004/0057036 A1 | 3/2004 | Kawashima et al. |
| 2004/0119954 A1 | 6/2004 | Kawashima et al. |
| 2004/0166422 A1 | 8/2004 | Yamazoe et al. |
| 2004/0180294 A1 | 9/2004 | Baba-Ali et al. |

FOREIGN PATENT DOCUMENTS

| JP | 2000-40656 A | 2/2000 |
| JP | 2003-203850 A | 7/2003 |
| JP | 2003-318100 A | 11/2003 |
| JP | 2004-272228 A | 9/2004 |
| JP | 2005-055878 A | 3/2005 |

OTHER PUBLICATIONS

Hochul Kim et al.; "Layer Specific Illumination Optimization by Monte Carlo Method"; Optical Microlithography XVI; Anthony Yen, Editor: Proceedings of SPIE, 2003; pp. 244-250; vol. 5040.

*Primary Examiner* — Kathleen Duda
*Assistant Examiner* — Caleen O Sullivan
(74) *Attorney, Agent, or Firm* — Rossi Kimms & McDowell LLP

(57) ABSTRACT

An exposure method includes the steps of illuminating a mask that has a contact hole pattern using an illumination light, and projecting, via a projection optical system, the contact hole pattern onto a substrate to be exposed, wherein three lights among diffracted lights from the contact hole pattern interfere with each other, wherein said mask is an attenuated phase shift mask, and wherein said illumination light forms a radial polarization illumination.

2 Claims, 40 Drawing Sheets

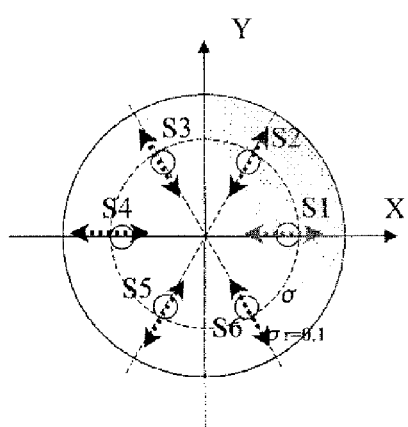
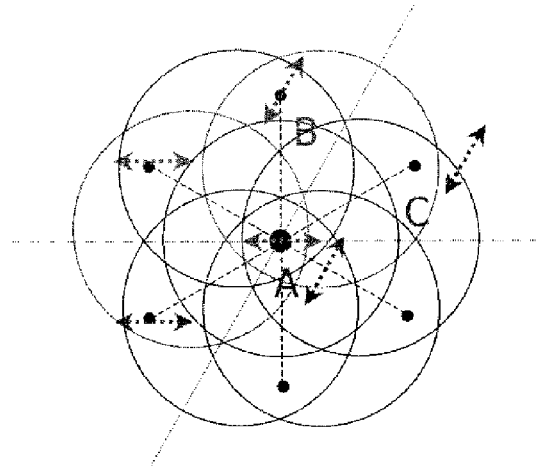
FIG. 3A　　　　　　FIG. 3B
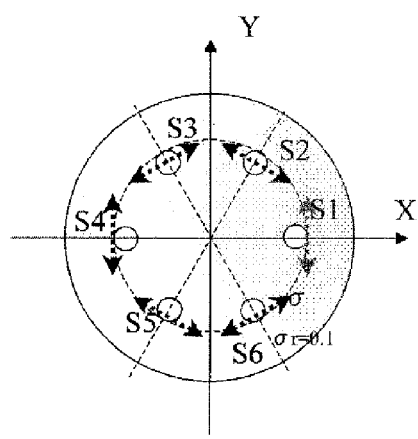
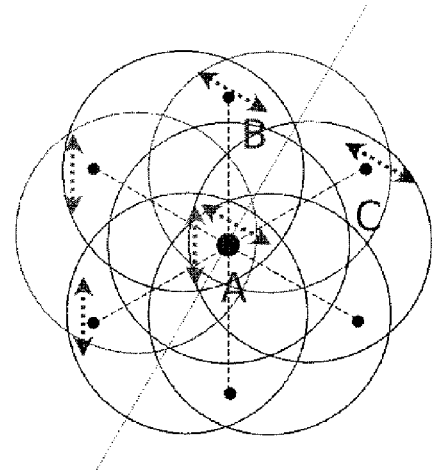
FIG. 3C　　　　　　FIG. 3D $k1=0.5$ $P/2=72 (nm)$ $w=72(nm), wi=72*1.06(nm), s=wi*0.75(nm)$ k1=0.45

P/2=65(nm)

w=65(nm), wi=65*1.20(nm), s =wi*0.75(nm)

EXPOSURE METHOD

This is a continuation of and claims priority from U.S. patent application Ser. No. 11/549,279 filed Oct. 13, 2006, the content of which is incorporated herein by reference.

BACKGROUND OF THE INVENTION

The present invention relates generally to exposure, and more particularly to an exposure method that is used to fabricate various devices, such as semiconductor chips, display devices, sensing devices and image pick-up devices, and fine contact hole patterns used for micromechanics. Here, the micromechanics is technology for applying the semiconductor IC fabrication technique for fabrications of a fine structure, thereby creating an enhanced mechanical system that may operate at a level of micron.

The photolithography technology for fabricating fine semiconductor devices has conventionally used a projection exposure apparatus that uses a projection optical system to project and transfer a mask (or reticle) pattern onto a wafer. The mask pattern includes a contact. As the critical dimensions of the circuit layout become smaller, it has become more difficult to resolve a fine contact hole stably. A transfer of the pattern with high resolution requires a selection of optimal exposure conditions (such as kinds of masks, illumination condition, etc.) in accordance with kinds of patterns. Moreover, a stabilization of an imaging performance requires a large depth of focus, and the illumination condition affects the depth of focus.

The contact hole pattern includes several kinds, such as a contact hole sequence that periodically arranges contact holes that are adjacent each other and an isolated contact hole that is isolated. A matrix pattern form that arranges a square hole and a checker pattern form that alternately arranges each sequence are known as the contact hole sequence. An actual circuit pattern includes both of the matrix pattern and checker pattern. The illumination condition for the circuit pattern including only the matrix pattern or the circuit pattern including the matrix pattern and checker pattern is already proposed. For example, an annular illumination is suitable for the illumination condition for the circuit pattern including the matrix pattern and checker pattern. The contact hole pattern that has a rectangle form is known. See, for example, Hochul Kim et al., "Layser Specific Illumination Optimization by Monte Carlo Method," Optical Microlithography XVL, Anthony Yen, Editor, Proceedings of SPIE, Vol. 5040 (2003), pp. 244-250.

A binary mask, a phase shift mask, and an attenuated phase shift mask are known as a kind of mask. The illumination condition includes a polarization condition, a tangential polarization is suitable for a two beam interference, and a radial polarization is suitable for a four beam interference. A polarization control is important technology in the exposure apparatus that includes the projection optical system with high NA, such as an immersion exposure apparatus.

Japanese Patent Applications, Publication Nos. 2000-040656, 2003-203850, 2004-272228 and 2003-318100 are proposed as other conventional technology.

If $0^{th}$ diffracted light is set as a center of pupil in the projection optical system, checker pattern generates $\pm 1^{th}$ diffracted light in six directions of around the center of pupil in the projection optical system. Although the two beam interference is effective for the resolution of line, the resolution of contact hole needs three or more beam. If three beam are suitably arranged in the pupil, $k_1$ of Rayleigh equation reduces, the finer is promoted. Here, Rayleigh equation is expressed by the following equation using a resolution R of the projection exposure apparatus, a wavelength $\lambda$ of a light source, a numerical aperture NA of the projection optical system, and a process constant $k_1$ determined by a development process.

$$R = k_1(\lambda/NA) \tag{1}$$

The checker pattern has a lot of the number of $1^{th}$ diffracted light that can enter the pupil, and three beam can be easily arranged in the pupil. Therefore, the contact hole pattern that includes only checker pattern will push forward low k1. However, the analysis of optimal exposure conditions for checker pattern including optimal polarization condition for the three beam interference is not fully progressing.

BRIEF SUMMARY OF THE INVENTION

Accordingly, the present invention is directed to an exposure method that improves a resolution performance of a checker pattern.

An exposure method of one aspect of the present invention includes the steps of illuminating a mask that has a contact hole pattern using an illumination light, and projecting, via a projection optical system, the contact hole pattern onto a substrate to be exposed, wherein said contact hole pattern is a checker pattern that includes a periodic pattern, in which plural contact holes are arranged in a first direction at a first pitch, and arranged in a second direction perpendicular to the first direction at a second pitch, while shifting by half a pitch, wherein an effective light source formed on a pupil plane in the projection optical system by the illumination light has six poles, wherein a distance between centers of gravity of the six poles and an optical axis of the projection optical system is commonly a, wherein said centers of gravity of the six poles are located around the optical axis in a direction of an angle $\alpha$ to the first direction, wherein said angle $\alpha$ is 0, $2\alpha$, $\pi-2\alpha$, $\pi$, $\pi+2\alpha$, and $2\pi-2\alpha$, wherein $Pxo/2=(Px/2)NA/\lambda$, $Pyo/2=(Py/2)NA/\lambda$, $\alpha=\tan^{-1}(Pxo/(2Pyo))$, and $a=1/(4(Pyo/2)/\sin(2\alpha))$ are satisfied, where Px is the first pitch, Py is the second pitch, NA is a numerical aperture of the projection optical system, and $\lambda$ is a wavelength of the illumination light, and wherein three beam among diffracted lights from the contact hole pattern interfere with each other.

An exposure method according to another aspect of the present invention includes the steps of illuminating a mask that has a contact hole pattern using an illumination light, and projecting, via a projection optical system, the contact hole pattern onto a substrate to be exposed, wherein three beam among diffracted lights from the contact hole pattern interfere with each other, wherein said mask is an attenuated phase shift mask, and wherein said illumination light forms a radial polarization illumination.

An exposure method according to still another aspect of the present invention includes the steps of illuminating a mask that has a contact hole pattern using an illumination light, and projecting, via a projection optical system, the contact hole pattern onto a substrate to be exposed, wherein three beam among diffracted lights from the contact hole pattern interfere with each other, wherein said mask is a binary mask, and wherein said illumination light forms a tangential polarization illumination or unpolarized polarization illumination.

Other objects and further features of the present invention will become readily apparent from the following description of the preferred embodiments with reference to the accompanying drawings.

BRIEF DESCRIPTION OF THE DRAWINGS

FIG. 3A is a schematic plane view of a radial polarization of an illumination light, FIG. 3B is a view of a polarization state of three beam on a pupil plane in a polarization state of two light sources shown in FIG. 3A, FIG. 3C is a schematic plane view of a tangential polarization of an illumination light, and FIG. 3D is a polarization state of three beam on a pupil plane in a polarization state of two light sources shown in FIG. 3C.

DETAILED DESCRIPTION OF THE PREFERRED EMBODIMENTS

Figure 1:
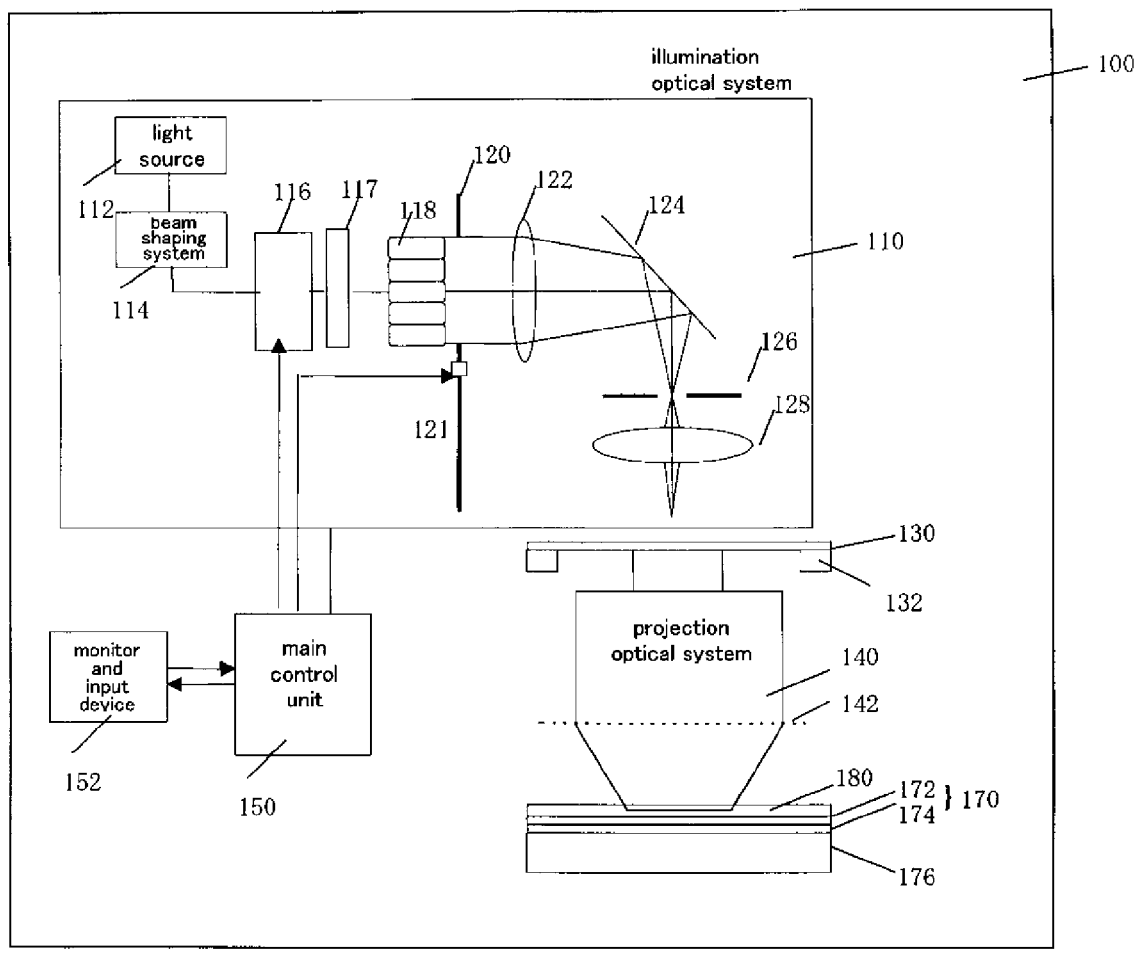
FIG. 1 is a schematic block diagram of an exposure apparatus of one embodiment according to the present invention.

Hereinafter, referring to FIG. 1, a description will be given of an exposure apparatus 100 of one aspect according to the present invention. Here, FIG. 1 is a schematic block diagram of the exposure apparatus 100. The exposure apparatus 100 includes, as shown in FIG. 1, an illumination apparatus 110, a mask (reticle) 130, a projection optical system 140, and a main control unit 150.

The exposure apparatus 100 is an immersion exposure apparatus immerses a space between a final surface (final lens) of the projection 140 at a substrate 170 side and the substrate 170 in a liquid 180, and exposes a pattern of the mask 130 onto a substrate 170 via the liquid 180. Although the exposure apparatus 100 of the instant embodiment is a step-and-scan manner projection exposure apparatus, the present invention is applicable to a step-and-repeat method and other exposure method.

The illumination apparatus 110 illuminates the mask 130 that has a circuit pattern to be transferred, and includes a light source section and an illumination optical system.

The light source section includes a laser 112 as a light source and a beam shaping system 114. The laser 112 may be pulsed laser such as an ArF excimer laser with a wavelength of approximately 193 nm, a KrF excimer laser with a wavelength of approximately 248 nm, an $F_2$ laser with a wavelength of approximately 157 nm, etc. A kind of laser, the number of laser, and a type of light source section is not limited. Moreover, the light source applicable for the light source section is not limited to the laser 112, and may use one or more lamps such as a mercury lamp and a xenon lamp.

The beam shaping system 114 uses, for example, a beam expander, etc., with a plurality of cylindrical lenses. The beam shaping system 114 can covert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and a divergent angle necessary for illuminating an optical integrator 118 described later. The illumination optical system is an optical system that illuminates the mask 130. The illumination optical system includes, in the instant embodiment, a condensing optical system 116, a polarization controller 117, the optical integrator 118, an aperture stop 120, a condenser lens 122, a deflecting mirror 124, a masking blade 126, and an imaging lens 128. The illumination optical system can realize various illumination modes, such as a conventional illumination, an annular illumination, a quadrupole illumination, a hexapole illumination described later, etc.

The condensing optical system 116 includes plural optical elements, and efficiently introduces a beam with the desired shape into the optical integrator 118. For example, the condensing optical system 116 involves a zoom lens system to control the shape and an angular distribution of the incident beam to the optical integrator 118.

The condensing system 116 further includes an exposure dose adjusting part that can change an exposure dose of the illumination light for the mask 130 per illumination. The exposure dose adjusting part is controlled by the main control unit 150. An exposure dose monitor may be placed between the optical integrator 118 and the mask 130 or another place to measure the exposure dose, and the measurement result may be fed back.

The polarization controller 117 includes, for example, a polarization element at an approximately conjugate to a pupil 142 of the projection optical system 140. The polarization controller 117 controls, as described later, a polarization state in a predetermined region in an effective light source formed on the pupil 142. The polarization controller 117 includes plural types of polarization elements that are provided on a turret rotatable by an actuator (not shown), and the main control unit 150 controls a driving of the actuator.

The optical integrator 118 forms uniform illumination light that illuminates the mask 130, includes a fly-eye lens in the instant embodiment for converting the angular distribution of incident light into a positional distribution, and exits the light. However, the optical integrator 118 usable for the present invention is not limited to the fly-eye lens, and can include an optical rod, a diffraction optical element, and a micro-lens array etc.

Provided right after an exit plane of the optical integrator 118 is the aperture stop 120 that has a fixed shape and diameter. The aperture stop 120 is arranged at a position approximately conjugate to the pupil 142 of the projection optical system 140 as described later, and an aperture shape of the aperture stop 120 defines a shape of the effective light source on the pupil 142 plane in the projection optical system 140. The aperture stop 120 controls, as described later, the shape of the effective light source.

Various aperture stop described later can be switched so that it is located on an optical path by a stop exchange mechanism (or actuator) 121 according to illumination conditions. A drive control unit 151 controlled by the main control unit 150 controls a driving of the actuator 121. The aperture stop 120 may be integrated with the polarization controller 117.

The condenser lens 122 condenses plural beams that have exited from a secondary light source near the exit plane of the optical integrator 118 and passed the aperture stop 120. The beams are reflected by the mirror 124, and uniformly illuminate or Koehler-illuminate the masking blade 126 plane as a target surface.

The masking blade 126 includes plural movable shielding boards, and has a rectangular opening shape corresponding to a shot area of the projection optical system 140. The masking blade 126 is a stop having an automatically variable opening width. Moreover, the exposure apparatus 100 further includes a stop having a slit shape opening, and the stop is arranged near the masking blade 126.

The imaging lens 128 images the opening shape of the masking blade 126 onto the mask 130 plane.

Figure 4A:
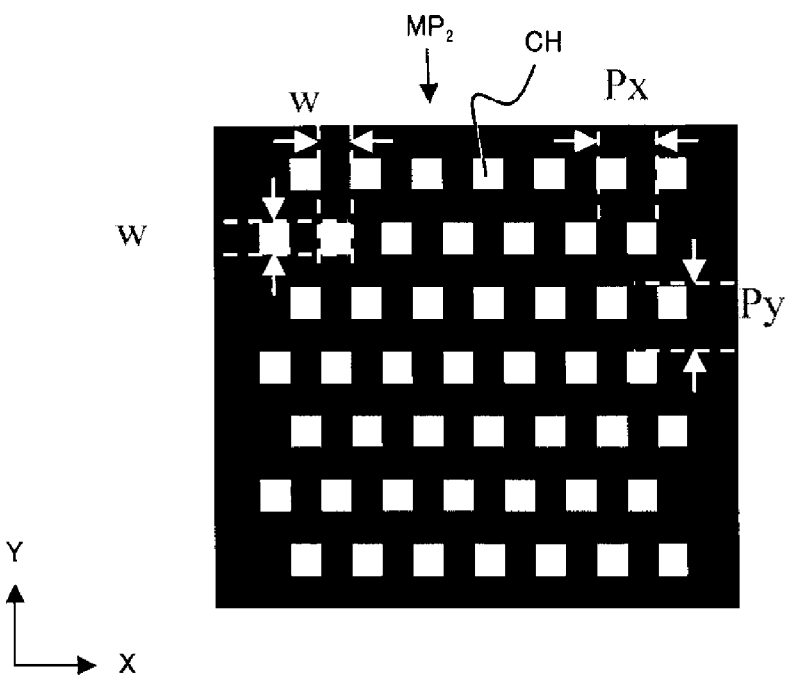
FIG. 4A is a plane view of one example of a mask pattern shown in FIG. 1 that applied the basic pattern shown in FIG. 2B.

The mask 130 has the pattern to be transferred, and is supported and driven by a mask stage 132. FIG. 4A shows an example of the mask pattern. Here, FIG. 4A is a plane view of one example of a contact hole pattern formed on the mask 130. A detailed description will be given of the pattern later. A diffracted light emitted from the mask 130 is projected onto the substrate 170 by the projection optical system 140. The substrate 170 includes a wafer 174 and a photoresist 172 that is applied onto the wafer 174. The mask 130 and the substrate 170 are arranged in an optically conjugate relationship. The exposure apparatus 100 is the step-and-scan manner exposure apparatus (i.e., scanner), and scans the mask 130 and the substrate 170 to transfer the pattern of the mask 130 onto the substrate 170. When the exposure apparatus 100 is the step-and-repeat manner exposure apparatus (i.e., stepper), the mask 130 and the substrate 170 are kept stationary during exposure.

The mask stage 132 supports the mask 130, and is connected to a moving mechanism (not shown). The mask stage 132 and the projection optical system 140 are installed on a stage barrel stool supported via a damper, for example, to a base frame placed on the floor. The mask stage 132 can use any structure known in the art. The moving mechanism (not shown) is made of a liner motor and the like, and can move the mask 130 by driving the mask stage 132 in X-Y directions. The exposure apparatus 100 synchronously scans the mask 130 and the substrate 170 under control by the main control unit 150.

The projection optical system 140 serves to image the diffracted light that has been generated by the pattern of the mask 130 onto the substrate 170. The projection optical system 140 may use a dioptric optical system including a plurality of lens elements, and a catadioptirc optical system including a plurality of lens element and at least one concave mirror, etc.

The main control unit 150 controls driving of each component, and particularly controls the illumination based on information input into a monitor and input device 152, information from the illumination apparatus 110, and a program stored in a memory (not shown). More specifically, the main control unit 150 controls, as described later, the shape and polarization state of the effective light source formed on the pupil 142 of the projection optical system 140. Control information and other information for the main control unit 150 are indicated on a display of the monitor and input device 152.

The wafer 174 is replaced with a liquid crystal plate in another embodiment.

The wafer 174 is supported by a wafer stage 176. The wafer stage 174 may use any structure known in the art, and thus a detailed description of its structure and operations is omitted. For example, the wafer stage 176 uses a liner motor to move the wafer 174 in X-Y directions. The mask 130 and the wafer 174 are, for example, scanned synchronously, and the positions of the mask stage 132 and the wafer stage 176 are monitored, for example, by a laser interferometer and the like, so that both are driven at a constant speed ratio. The wafer stage 176 is installed on a stage stool supported on the floor and the like, for example, via a dumper.

The liquid 180 uses, for example, a pure water.

Hereinafter, referring to FIGS. 2B and 4A. a description will be given of a basic example of a mask pattern $MP_1$. Here, FIG. 2B is a plane view of the basic example of the mask pattern $MP_1$. The mask pattern $MP_1$, as shown in FIG. 2B, consists of holes so that the centers of the holes may make triangular grids.

FIG. 2B shows a binary mask. In the mask pattern $MP_1$, the contact hole $CH_1$ and the contact hole $CH_2$ are light transmitting part, and LS is light shielding part.

FIG. 4A is a plane view of contact hole pattern $MP_2$ is an aggregate of the hole pattern $MP_1$. In FIG. 4A, W is a width of the contact hole $CH_1$ Px is a pitch in X direction, and Py is a pitch in Y direction. A contact hole array comprises a plurality of periodic patterns having the pitch Px in X direction (first direction). The plurality of periodic patterns are arranged in Y-direction (second direction) while shifting by half a pitch (Px/2) to an upper and lower contact hole arrays, and the centers of the contact holes may make triangular grids.

In the binary mask, the contact hole CH (white portion) is the light transmitting part with a transmittance of 1, and the background (black portion) is the light shielding part LS with a transmittance of 0. In the attenuated phase shift mask, the hole (white part) is the transmitting part with a transmittance of 1, the background (black portion) is a half shielding part with a transmittance of approximately 6%, and a phase of the background (black portion) inverts by 180 degrees to a phase of the hole portion (white part). In an alternated phase shift mask, such a pattern cannot be arranged as described later.

The pitch Px in X-direction and the pitch Py in Y-direction are normalized by $\lambda/NA$, and the pitches Px and Py is determined to satisfy the following expressions.

$$Pxo/2=(Px/2)NA/\lambda \quad (2)$$

$$Pyo/2=(Py/2)NA/\lambda \quad (3)$$

$$1/(4(Pyo/2))/\sin(2\alpha)>1 \quad (4)$$

$$(1/2(Pyo/2))\sin(\tan^{-1}(2\sin(2\alpha)))<1 \quad (5)$$

In particular, if Pitch Py is $Py=\sqrt{3}Px/2$, then a certain hole is equal distance to six neighboring holes, and the triangular grid pattern. In this case, a half pitch of the pattern (Px/2) is determined by the following expression.

$$0.33\lambda/NA<Px/2<0.67\lambda/NA \quad (6)$$

If the half pitch of the pattern is determined, the NA of the projection optical system satisfied the following expression, where P is the pitch.

$$0.33\lambda/(P/2)<NA<0.67\lambda/(P/2) \quad (7)$$

Figure 20:
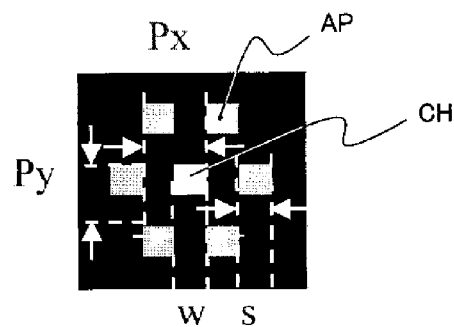
FIG. 20 is a schematic plane view for explaining an insertion method of an auxiliary pattern for an isolated pattern.
Figures 21A, 21B, 21C, 21D:
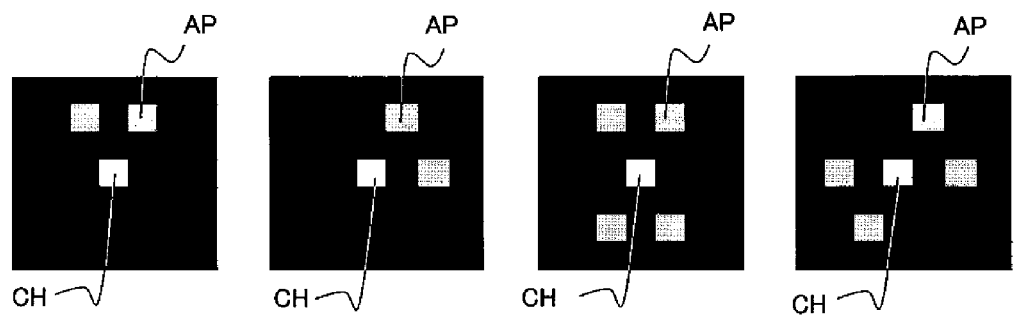
FIGS. 21A to 21D are schematic plane views for explaining an insertion method of an auxiliary pattern for an isolated pattern.

If the isolated pattern is formed, six auxiliary patterns AP are arranged around the target pattern (isolated pattern) CH as shown in FIG. 20 by the methods disclosed in Japanese Patent Applications, Publication Nos. 2004-272228 and 2003-318100. In FIG. 20, S is a length of one side of the auxiliary pattern AP, and W is a length of one side of the target pattern CH. FIG. 20 shows the target pattern CH as a white pattern and the auxiliary pattern AP as a gray pattern. In this case, an exposure condition is set so that the target pattern CH is resolved and the auxiliary pattern is prevented from being resolved. If a pitch in a lateral direction is Px and a pitch in a longitudinal direction is Py, the pitch Px is set to the range of the expression (6). In other words, if a standardized value of the half pitch (Px/2) by $\lambda/NA$ is $k_1$, $k_1$, is set to $0.33<k_1<0.67$. Therefore, all pitches between the holes that are $Py=\sqrt{3}Px/2$ is Px/2, and the triangular grid pattern.

When the six auxiliary patterns AP cannot be arranged because other patterns exist, the auxiliary patterns AP are arranged so that the triangle is formed as shown in FIGS. 21A to 21D. Here, FIGS. 21A to 21D are schematic plane views of an insertion method of the auxiliary patterns to the isolated pattern. The width S of the auxiliary pattern AP may be 0.6 times to 0.8 times of the half pitch Px/2 of the target pattern CH to prevent the resolution of the auxiliary pattern AP. Generally, a size of the auxiliary pattern AP is 0.6 times to 0.8 times of the half pitch of the auxiliary pattern AP or 0.6 times to 0.8 times of a size of the isolated contact hole CH. Even when the isolated patterns with a different size are exposed at the same time, all the half pitches of the auxiliary patterns are set to equal.

Figure 2A:
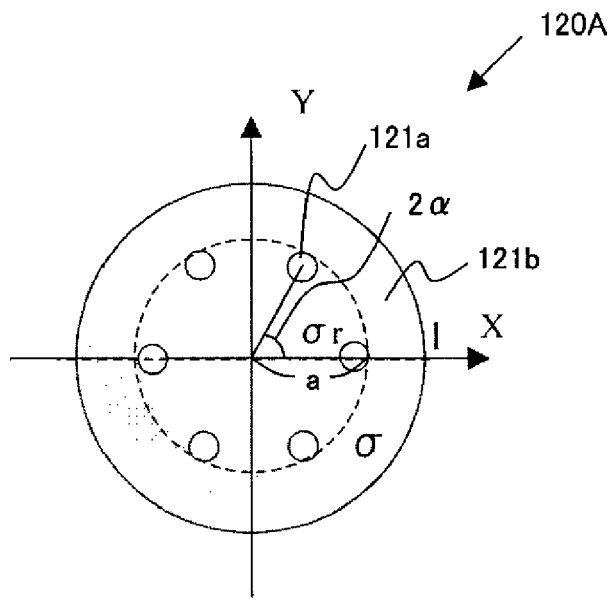
FIG. 2A is a schematic plane view of one example of an aperture stop that is applicable to the exposure apparatus shown in FIG. 1.
Figure 2B:
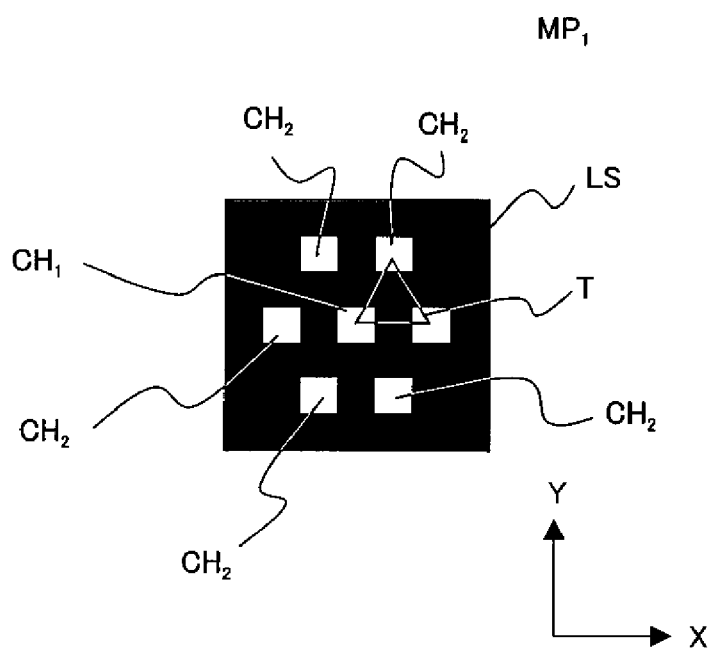
FIG. 2B is a plane view of a basic example of a mask pattern in the exposure apparatus shown in FIG. 1.

FIG. 2A is a schematic plane view of an aperture stop 120A that is configured as a stop for the hexapole illumination applicable to the aperture stop 120. The aperture stop 120A includes six circles with a σ of 0.2 or less at a center. Here, the σ is a value that divides the numerical aperture of the illumination optical system by the numerical aperture of the illumination optical system 140, and corresponds to a size of diameter of the illumination light on the pupil plane in the projection optical system 140 when a diameter of pupil of the projection optical system 140 is 1.0. The aperture stop 120A includes a transmitting part 121a (white portion) with a transmittance of 1 having six circles and a shielding part 121b (gray portion) with a transmittance of 0. The effective light source is arranged as shown in FIG. 2A to the contact hole pattern MP shown in FIG. 2B. A center position (center of gravity position) of one pole of such a hexapole effective light source is expressed by the following expressions.

$$\alpha = \tan^{-1}(Pxo/(2Pyo)) \quad (8)$$

$$a = 1/(4(Pyo/2)/\sin(2\alpha)) \quad (9)$$

a is a distance from a pupil center (an optical axis of the projection optical system 140) to the center position of each pole 121*a*, and is equal to each pole. As above-described, a direction from the pupil center to the center position of each pole 121*a* is 0, 2α, π−2α, π, π+2α, and 2π−2α, when X-direction is a standard. Particularly, when the pitch Py is determined to Py=√3Px/2, the half pitch (Px/2) is expressed by the following expression using $k_1$.

$$Px/2 = k_1(\lambda/NA) = Pxo/2(\lambda/NA) \quad (10)$$

The center positions of each pole of hexapole are near 1/(3(Pxo/2))=1/(3$k_1$), and are arranged in directions of 0 degree, 60 degrees, 120 degrees, 180 degrees, 240 degrees, and 300 degrees when X-direction from the optical axis is a standard. In this case, a direction to circumference contact hole patterns centering on the certain contact hole pattern accords with a direction to each pole of hexapole from the optical axis of the projection optical system 140.

Although a shape of each pole 121*a* of hexapole is circle in FIG. 2A, it may be an arc or a sector. Preferably, center positions of six poles are a rotational symmetry shape to the optical axis of the projection optical system 140.

Figure 16A:
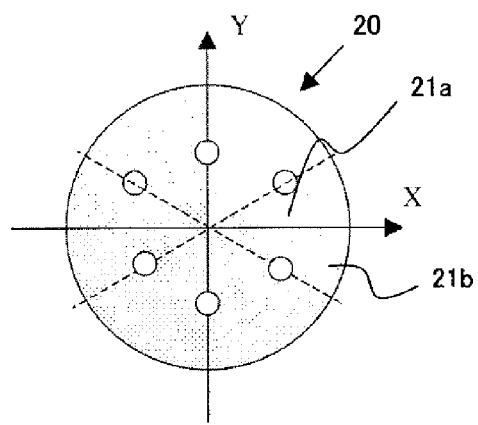
FIG. 16A is a schematic plane view of an aperture stop having a shape that is not applied to the aperture stop of the exposure apparatus shown in FIG. 1.
Figure 16B:
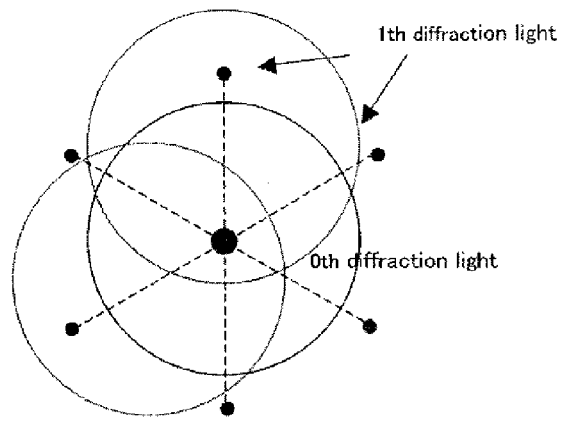
FIG. 16B is a schematic plane view of a two beam interference when a direction of a light source does not accord with a direction of a pattern.
Figure 16C:
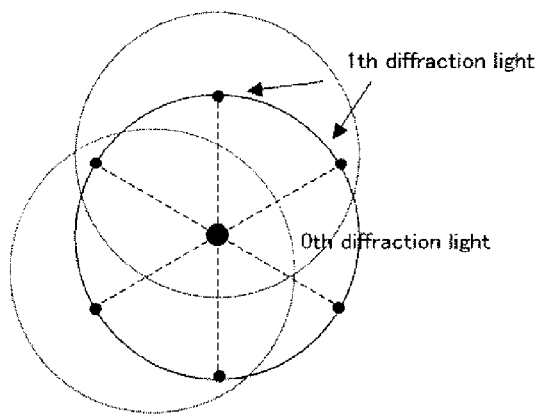
FIG. 16C is a schematic plane view of a four lights interference when a direction of a light source does not accord with a direction of a pattern.

As shown in FIG. 16A, when the direction from the optical axis to each pole of hexapole accords with the direction to the circumference contact hole patterns centering on the certain contact hole pattern of the basic pattern shown in FIG. 2B, the expression (8) is not satisfied. Here, FIG. 16A is a schematic plane view of an aperture stop that is configured as a stop for the hexapole illumination inapplicable to the aperture stop 120. If the expression (8) is not satisfied as shown in FIG. 16A, an imaging performance deteriorates. The fine pattern generates a two beam interference that interferences only two beam of $0^{th}$ diffracted light and $1^{th}$ diffracted light from the pattern as shown in FIG. 16B. Even if the pattern is large, a four beam interference that interferences four beam of $0^{th}$ diffracted light and three $1^{th}$ diffracted light from the pattern is generated as shown in FIG. 16C, and a three beam interference is not realized. Here, FIG. 16B is a schematic plane view of an example that generates the two beam interference when the direction from the optical axis to each pole of hexapole does not accords with the direction to the circumference contact hole patterns centering on the certain contact hole pattern. FIG. 16C is a schematic plane view of an example that generates the four beam interference when the direction from the optical axis to each pole of hexapole does not accords with the direction to the circumference contact hole patterns centering on the certain contact hole pattern. The contrast in one direction is only good and the contrast in the orthogonal direction is low in the two beam interference, a sufficient depth of focus is not obtained in the four beam interference that is asymmetrical to the pupil center shown in FIG. 16C, and the imaging performance degrades than the three beam interference.

Where a is a center position of each pole in a pupil coordinate system (or a distance in a radial direction from an origin in the pupil coordinate system).

Where α is a central angle of each pole in the pupil coordinate system (or a central angle from a X-axis in the pupil coordinate system).

Figure 17A:
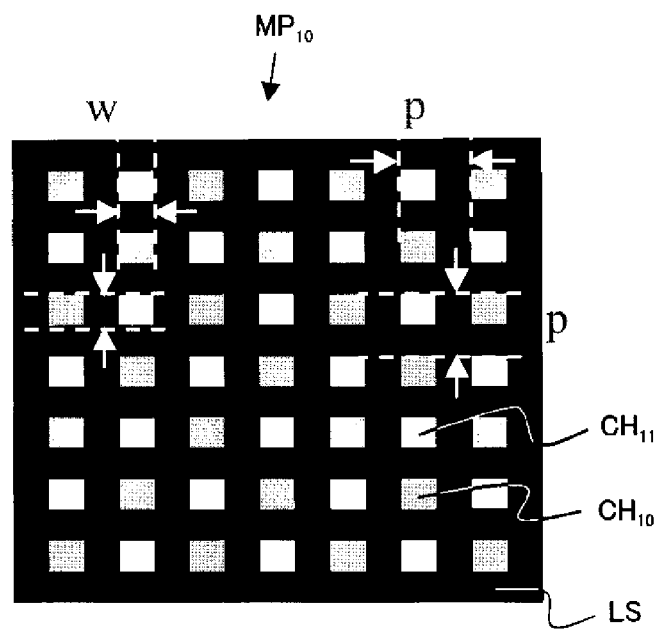
FIG. 17A is a schematic plane view of a phase shift mask that includes a matrix contact hole pattern.

Hereinafter, referring to FIGS. 17A and 17B, a description will be given of a reason that the phase shift mask is not desirable to the mask 130. Here, FIG. 17A is a schematic plane view of a phase shift mask that includes a matrix contact hole pattern $MP_{10}$. The phase shift mask cancels $0^{th}$ diffracted light by inverting the phase of light that transmits the adjacent transmitting parts on the mask by 180 degrees, and images by interfering two beam of $\pm 1^{th}$ diffracted light. This technology can substantially set $k_1$ of the above expression to 0.25 to the resolution of line and space (L & S) in one direction, can improve the resolution R, and can form the pattern of 0.1 μm or less on the wafer.

The pattern $MP_{10}$ includes, as the light transmitting part that inverts the phase of light from the adjacent transmitting part by 180 degrees, contact hole patterns $CH_{10}$ and $CH_{11}$ with a width W (nm) are periodically arranged at a pitch P (nm) in the light shielding part LS, such as chromium. FIG. 17A shows the light shielding part LS by a black portion and the light transmitting parts $CH_{10}$ and $CH_{11}$ by a white portion and gray portion, and the gray portion $CH_{11}$ has a phase that inverted a phase of the white portion $CH_{10}$ by 180 degrees.

Figure 17B:
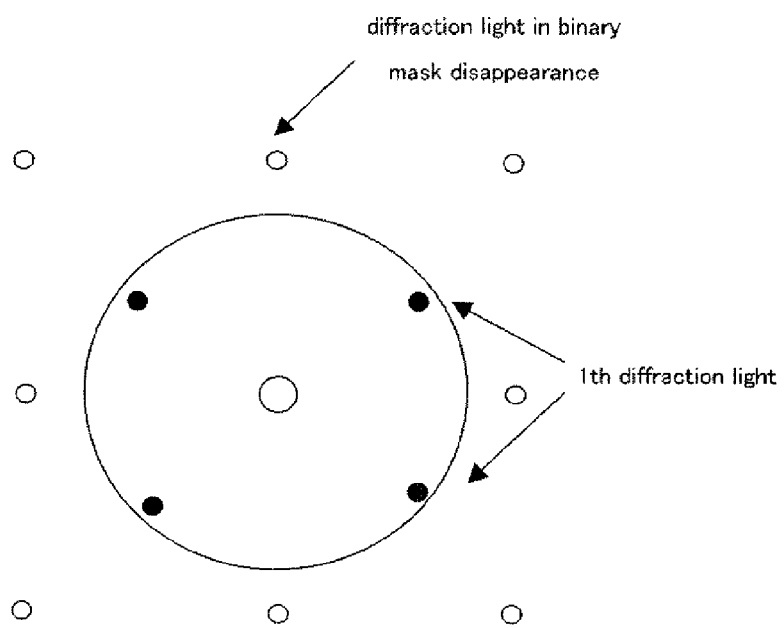
FIG. 17B is a schematic plane view of a position of a diffracted light in the pattern shown in FIG. 17A.

FIG. 17B shows diffracted light from the mask pattern $MP_{10}$. In FIG. 17B, $1^{th}$ diffracted light shown by a black dot is generated. Although diffracted light shown by a white dot is generated in the binary mask, $0^{th}$ diffracted light disappears and $1^{th}$ diffracted light has a pitch of half of the binary mask in the phase shift mask. If a length of half pitch is $k_1$, although the pattern to $k_1$=0.25√12=0.358 passes the pupil, the pattern with a length of the half pitch smaller than this does not pass the pupil (see, Japanese Patent Application, Publication No. 2000-040656). A resolvable pattern is until a fine pattern of √2 that is a resolution limit of line and space (L & S).

Figure 18A:
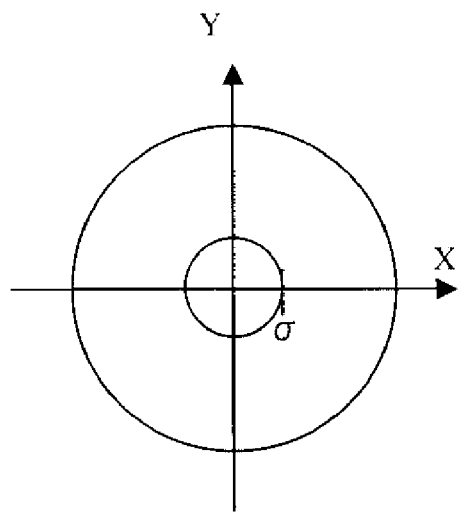
FIG. 18A is a schematic plane view of a circular effective light source shape.
Figure 19A:
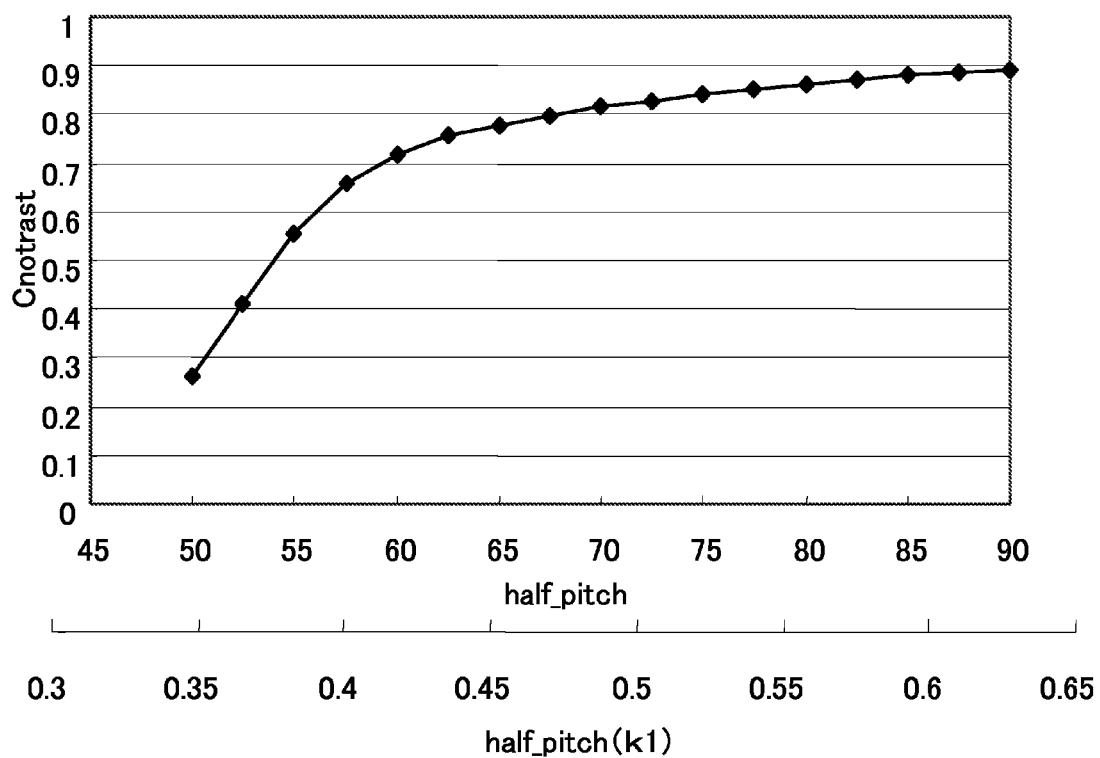
FIG. 19A is a graph of a relationship between a pitch and a contrast when the contact hole pattern shown in FIG. 17A is illuminated by the effective light source shape shown in FIG. 18A.
Figure 19B:
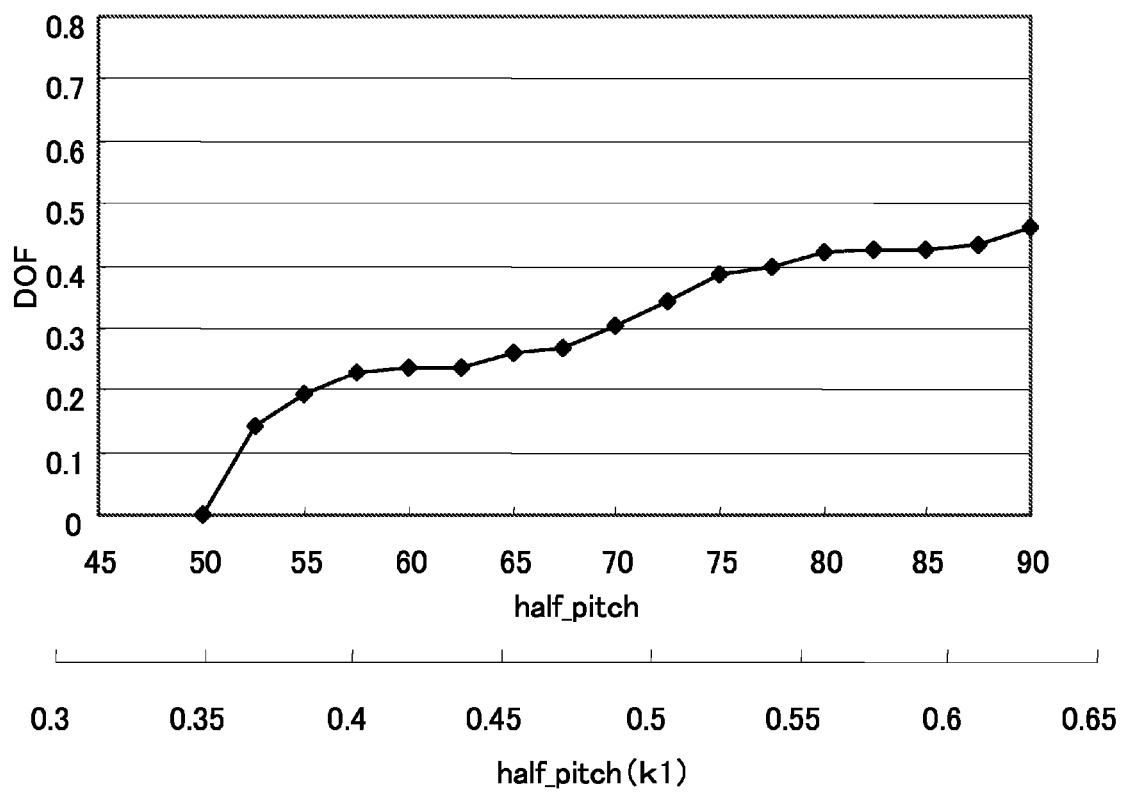
FIG. 19B is a graph of a relationship between a pitch and a depth of focus when the contact hole pattern shown in FIG. 17A is illuminated by the effective light source shape shown in FIG. 18A.

When the phase shift mask shown in FIG. 17A is illuminated by the illumination light that forms the circular effective light source of σ=0.2 shown in FIG. 18*a* using ArF excimer laser and the immersion exposure apparatus with a NA of 1.35, the contrast changes as shown in FIG. 19A according to a change of the length of the half pitch, and the depth of focus changes as shown in FIG. 19B. The length of the half pitch is $k_1$, and a unit of the depth of focus is μm. The depth of focus is a range that can obtain the contrast of 40% or more and tolerates a change of ±10% of the width of contact hole from 0.9 times to 1.1 times to the predetermined width W.

In this case, the half pitch that can obtain 40% or more of contrast is $k_1$>0.37, and the contrast is good in a larger half pitch than this. However, the depth of focus is almost 0.15 μm to 0.2 μm, and is not adapted for a mass production. If the half pitch is $k_1$=0.50 or more, the half pitch of 0.3 μm or more necessary for the mass production can be obtained. Thus, although the image by the four beam interference has high contrast, the half pitch with $k_1$=0.50 or more is necessary to obtain a practical depth of focus.

On the other hand, a method for the resolution of contact hole sequence to $k_1$=0.25, as an overlay of a longitudinal line and a lateral line in the resolution limit of L & S, has proposed to obtain the resolution of contact hole sequence similar to the resolution of L & S. See, for example, Japanese Patent Applications, Publication Nos. 2000-040656 and 2003-203850. This method forms the longitudinal line by the two beam interference and the lateral line by the two beam interference, and forms the contact hole sequence by a trellis pattern that overlays these. However, even if the longitudinal line and the lateral line is overlaid, since the contrast becomes only 0.5 at the maximum, it is hard to obtain an exposure tolerance and is not practical.

Figure 4B:
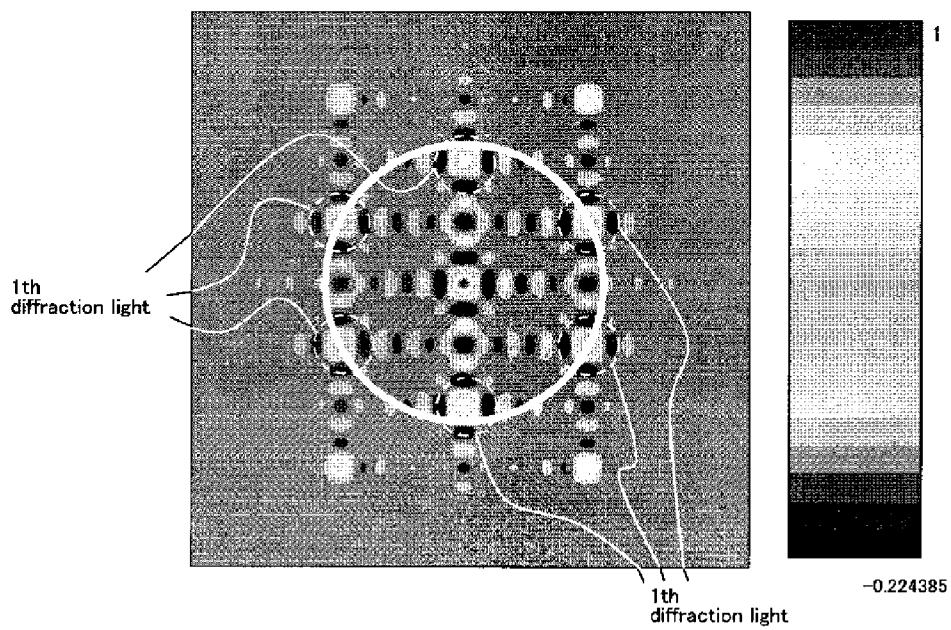
FIG. 4B is a plane view of a diffracted light from the pattern shown in FIG. 4A.

The three beam interference proposed in the instant embodiment solves this problem. Hereinafter, a description will be given of a method that resolves the contact hole pattern using the three beam interference. FIG. 4B shows a position of diffracted light from checker contact hole pattern $MP_2$ shown in FIG. 4A. Six $1^{th}$ diffracted lights are distributed around $0^{th}$ diffracted light as shown in FIG. 4B.

FIG. 4B is a diffracted light distribution from the binary mask, and shows an amplitude of diffracted light from the contact hole pattern with a contact hole width W of 80 (nm) and pitches Px and Py of 160 (nm) as shown in FIG. 4A. However, even if the mask is the attenuated phase shift mask, the pattern of diffracted light does not change but only an amplitude ratio between $0^{th}$ diffracted light and $1^{th}$ diffracted light is different. As reference, a size of the pupil is shown in FIG. 4B by a white circle when the NA of the projection optical system is 1.35. The standardized value of the half pitch of 80 (nm) by λ/NA, in other words, $k_1$ is 0.56.

Figure 5:
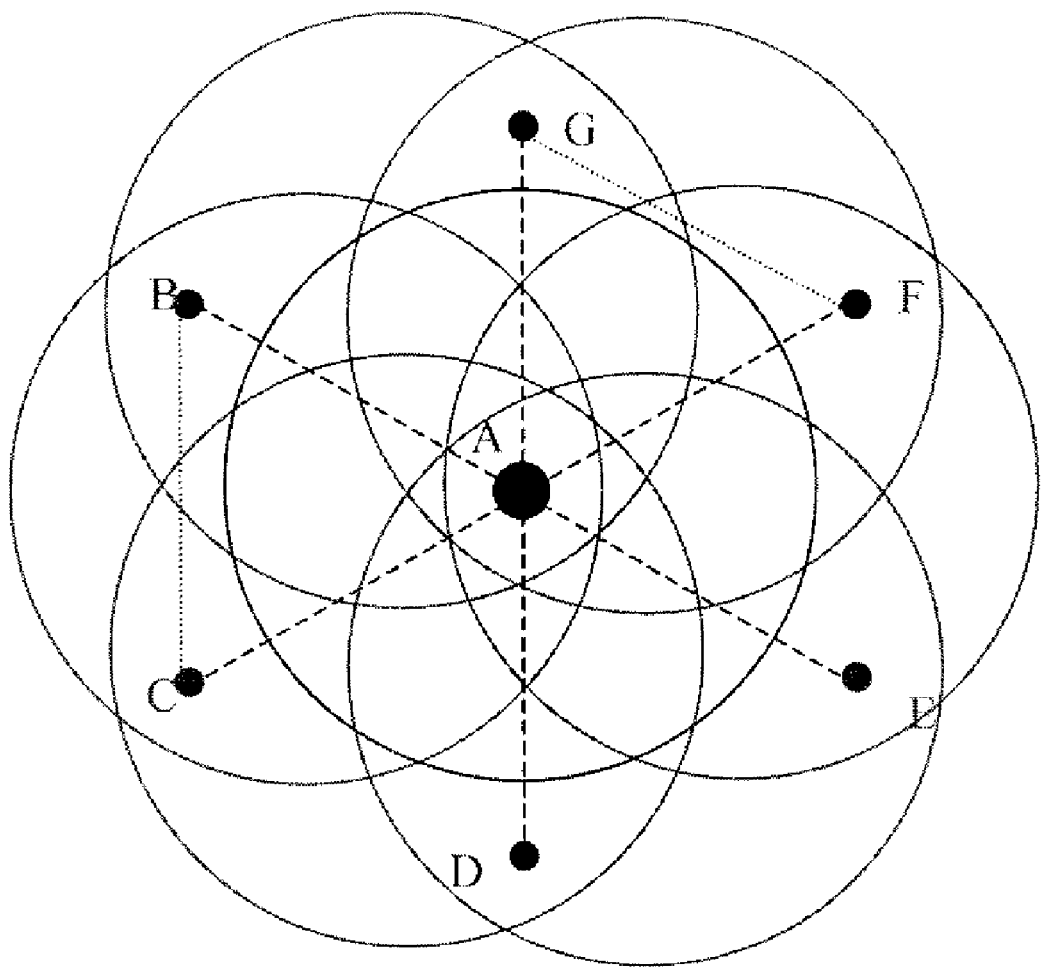
FIG. 5 is a view for explaining a three beam interference by shifting the pupil shown.

Here, when the pupil is shifted so that three beam enter the pupil, diffracted light is shown in FIG. 5. If the light inclines in three directions, three lights symmetrically enters as shown in FIG. 5. Then, if the image obtained from each is incoherent-added, the contact hole with high contrast is obtained. For this reason, the effective light source is the hexapole illumination as shown in FIG. 2, and the three beam interference is formed in six directions. Six $1^{th}$ diffracted lights B to G are distributed around a $0^{th}$ diffracted light A. The diffracted lights A to B interfere (three beam interference) in a first pupil, the diffracted lights A, C and D interfere in a second pupil, the diffracted lights A, D and E interfere in a third pupil, the diffracted lights A, E and F interfere in a fourth pupil, the diffracted lights A, F and G interfere in a fifth pupil, and the diffracted lights A, B and G interfere in a sixth pupil.

In the three beam interference, the three beam should symmetrically enter to the center position of the pupil to obtain the depth of focus. If a defocus generates, a wave front corresponds to a square of a distance from the pupil center. Therefore, if the three beam symmetrically enter to the center position of the pupil, a phase difference from a defocus wave front is lost (becomes 0). Thereby, when the defocus generates, a degradation of image becomes the minimum.

Figure 6A:
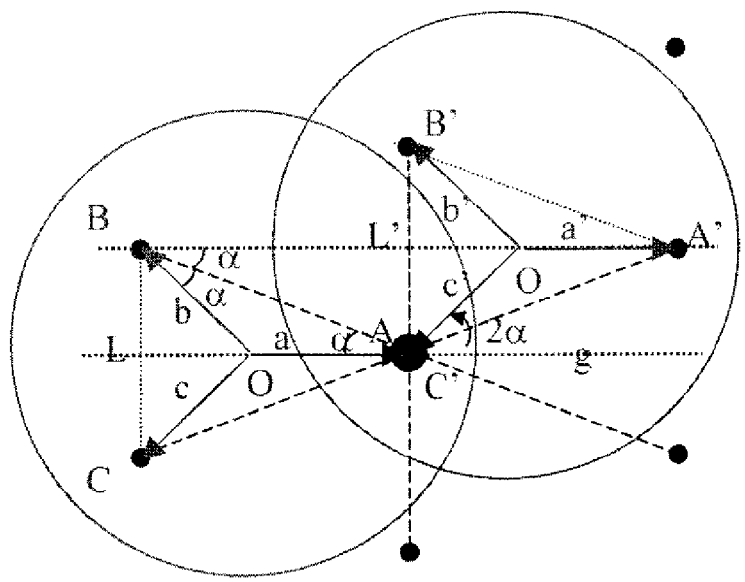
FIGS. 6A and 6B are schematic plane views for explaining a three lights interference of a diffracted light on the pupil.

A description will be given of the three beam interference of the diffracted lights A to C on the pupil shown in FIG. 6. In a condition on which distances a, b and c from the center are equal, if a middle point of BC is L, an angle between AB and AL is equal to an angle between AB and AO, a triangle ABC is equal to a triangle A'B'C', and an angle between AB and AL is equal to an angle between AB and BL' because AL is parallel to BL'. Therefore, if the angle between AB and AL is α, the following expression is materialized.

$$AL=A'L'=1/Px \quad (11)$$

$$BC=B'C'=1/Py \quad (12)$$

$$\alpha=\tan^{-1}(Px/(2Py)) \quad (13)$$

$$b\sin(2\alpha)=1/(2Py) \quad (14)$$

$$a=b=c=1/(2Py)/\sin(2\alpha) \quad (15)$$

In the three lights A, B and C, if the center position of the pupil is located on a point O, distances A, B and C of the three lights become equal. To locate the center position of the pupil in the point O, the expressions 8 and 9 are satisfied so that $0^{th}$ diffracted light separates from the center position of the pupil by a. If the direction of each pole of the hexapole is satisfied the above explained, the symmetry of the pattern becomes good. However, even if the direction shifts little, the pattern is resolved.

The minimum radius to enter the three lights to the pupil is expressed by the following expression.

$$a=b=c=1/(2Py)/\sin(2\alpha)<1 \quad (16)$$

Figure 6B:
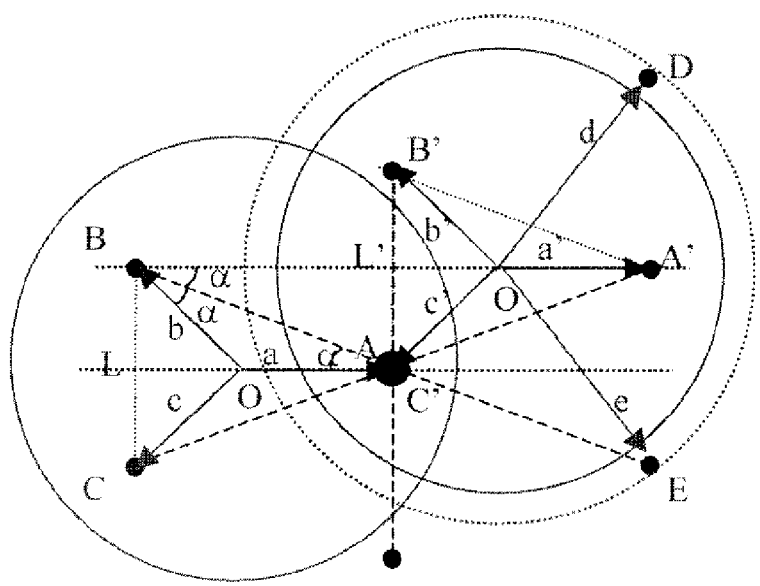

The maximum radius to enter the three lights to the pupil is a radius smaller than a dotted line of FIG. 6B. For example, a point O' is located on the center as shown in FIG. 6B in other light source of the light source that the point O is located on the center, and a=b=c=a'=b'=c' is satisfied. When the maximum radius is smaller than the dotted line, only three lights enter the pupil. However, the maximum radius is larger than the dotted line, diffracted lights of four or more lights enter the pupil, and the degradation of defocus becomes large. Therefore, the following expression is satisfied.

$$d=e=(1/Py)/\sin(\tan^{-1}(1/Py/a))=(1/Py)/\sin(\tan^{-1}(2\sin(2\alpha)))<1 \quad (17)$$

For example, when the pitch of the pattern is Px=Py=Pz and the half pitch of the pattern is $k_1$, the center position of the light source is $1/(3.2\,k_1)$. If the directions of each pole of the hexapole illumination are 53 degrees, 127 degrees, 180 degrees, 233 degrees and 307 degrees, the symmetry of the pattern becomes good. In this case, the minimum resolution satisfies the following expressions from $1/(3.2\,k_1)<1$.

$$k_1>0.3125 \quad (18)$$

$$0.3125<k_1<0.5896 \quad (19)$$

Therefore, when the size of the pupil (NA) is determined, the half pitch of the pattern is $0.31\,k_1<0.59$. When the half pitch of the pattern is determined, the size of the pupil (NA) preferably satisfies the following expression.

$$0.31\lambda/(P/2)<NA<0.59\lambda/(P/2) \quad (20)$$

Particularly, if the pitch of Py is determined to Py=√3Px/2, the triangular grid pattern that the six holes are arranged around one certain contact hole at pitch Px. In this case, the three lights becomes the equilateral triangle, if the three lights is symmetrically imaged to the pupil center, the depth of focus can be further obtained.

In the three beam interference, the number of contact holes integrated within the wafer plane is most numbers in this case. The half pitch of the pattern in the lateral direction is Px/2, all of half pitches between the holes are Px/2, and the equilateral triangle with AB=BC=CA is formed. If Px/2 is $k_1$, the following expressions are satisfied.

$$AB=BC=CA \quad (21)$$

$$a=b=c=1/(3k_1) \quad (22)$$

Therefore, the center position of the light source is $1/(3k_1)$. The minimum radius to enter the three lights to the pupil is expressed by the following expressions.

$$a=b=c=1/(3k_1)<1 \quad (23)$$

$$k_1>0.3333 \quad (24)$$

In the maximum radius to enter the three lights to the pupil, the following expressions are satisfied.

$$d=e=(1/Py)/\sin(\tan^{-1}(2\sin(2\alpha)))<1 \quad (25)$$

$$(1/(\sqrt{3}k_1))/0.866<1 \quad (26)$$

$$k_1<0.667 \quad (27)$$

Therefore, $0.33<k_1<0.67$ is satisfied. If the pitch is P, the following expression is satisfied from $k_1\lambda/NA$.

$$0.33\lambda/(P/2)<NA<0.67\lambda/(P/2) \quad (28)$$

Since the minimum resolution in the four beam interference is $k_1>0.25\sqrt{2}=0.358$, the resolution in the three beam interference is better than the resolution in the four beam interference. If the resolution limit is simply compared, the integrated degree improves by about 1.3 times. Hereinafter, a description will be given of a polarization state of the three beam interference. In the immersion exposure apparatus, the immersion exposure apparatus with a NA of 1.35 is planned. A refractive index of water is about 1.44. In an optical system with a NA of 1.35, if an incident angle is θ, θ is 70 degrees from NA=n sinθ and n=1.44. In an oblique incidence illumination with the incident angle of 70 degrees, the fine pattern near the resolution limit of the optical system interferes at the maximum incident angle, and a coherence decreases according to the polarization state. Therefore, the illumination light needs to have a good polarization direction of the coherence.

When the mask 130 is the attenuated phase shift mask, the polarization direction of the illumination light preferably is a polarization in a radial direction as shown in FIG. 3A. Here, FIG. 3A is a schematic plane view of the polarization direction of the illumination light when the mask 130 is the attenuated phase shift mask. The diffracted light from the mask 130 ideally has the same polarization direction as the incident light, and the polarization direction of $0^{th}$ diffracted light and the polarization directions of six $1^{th}$ diffracted lights around it are the same.

FIG. 3B shows a polarization state of the three beam in a polarization state of two light sources S1 and S5 among six light sources S1 to S6 of the hexapole illumination shown in FIG. 3A.

In one light source S5 of the hexapole illumination, $0^{th}$ diffracted light A and $1^{th}$ diffracted lights B and C interferes as shown in FIG. 3B. The diffracted lights A, B and C have the polarization direction shown in FIG. 3 by the radial polarization, and a coherence between A and C, a coherence between A and B and a coherence between B and C are good.

Particularly, in the attenuated phase shift mask, although the $0^{th}$ diffracted light A is different from the $1^{th}$ diffracted lights B and C in sign and size of amplitude, the coherence between B and C is important because B and C are the same.

In the attenuated phase shift mask, the polarization directions of the diffracted lights A, B and C rotates by 90 degrees by the tangential polarization, the contrast decreases because the coherence between the diffracted light B and the diffracted light C decreases.

In the binary mask, the polarization direction of the illumination light preferably is the tangential polarization as shown in FIG. 3C. Here, FIG. 3C is a schematic plane view of the polarization direction of the illumination light when the mask 130 is the binary mask. FIG. 3D shows a polarization state of two light sources S1 and S5 among six light sources S1 to S6 of the hexapole illumination shown in FIG. 3C. Since the $0^{th}$ diffracted light A and $1^{th}$ diffracted light B and C are the same sign of amplitude, the coherence between the diffracted light A and the diffracted light B and the coherence between the diffracted light A and the diffracted light C is better than the coherence between the diffracted light B and the diffracted light C and can obtain the contrast. In the binary mask, since a difference by polarization is not so large, the illumination light may be an unpolarized light. If the illumination light is the unpolarized light, the binary mask can obtain higher contrast than the attenuated phase shift mask.

First Embodiment

The pitches in the longitudinal direction and the lateral direction are the same (Px=Py=P), and the contrast and the depth of focus is shown when the contact hole is imaged changing the pitches using the ArF excimer laser with a wavelength of 193 nm and the immersion exposure apparatus 100 with a NA of 1.35. The refractive index is about 1.44. The mask 130 uses the attenuated phase shift mask.

A change of the contrast by the polarization direction was investigated. The effective light source is the hexapole illumination as shown in FIG. 2A, σ is 0.80, and a size of a local light source is σr=0.10. The radial polarization shown in FIG. 3A, the tangential polarization shown in FIG. 3B and the unpolarized light are compared as the polarization.

Figure 7:
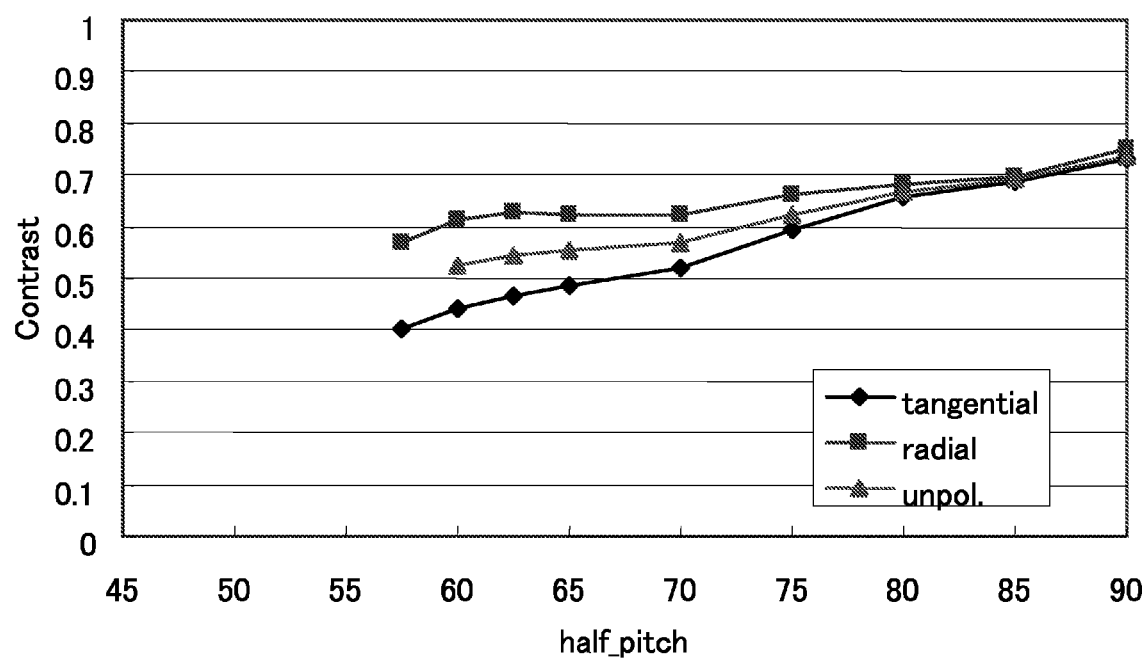
FIG. 7 is a graph of a relationship between a half pitch and a contrast that depend on a polarization state in a first embodiment.

FIG. 7 is a graph of this result. In FIG. 7, a lateral axis is the half pitch of the contact hole (nm), and a longitudinal axis is a contrast peak. The contact hole width W is W=P/2 and Px=Py=P. Referring to FIG. 7, the radial polarization obtains high contrast.

Figure 8:
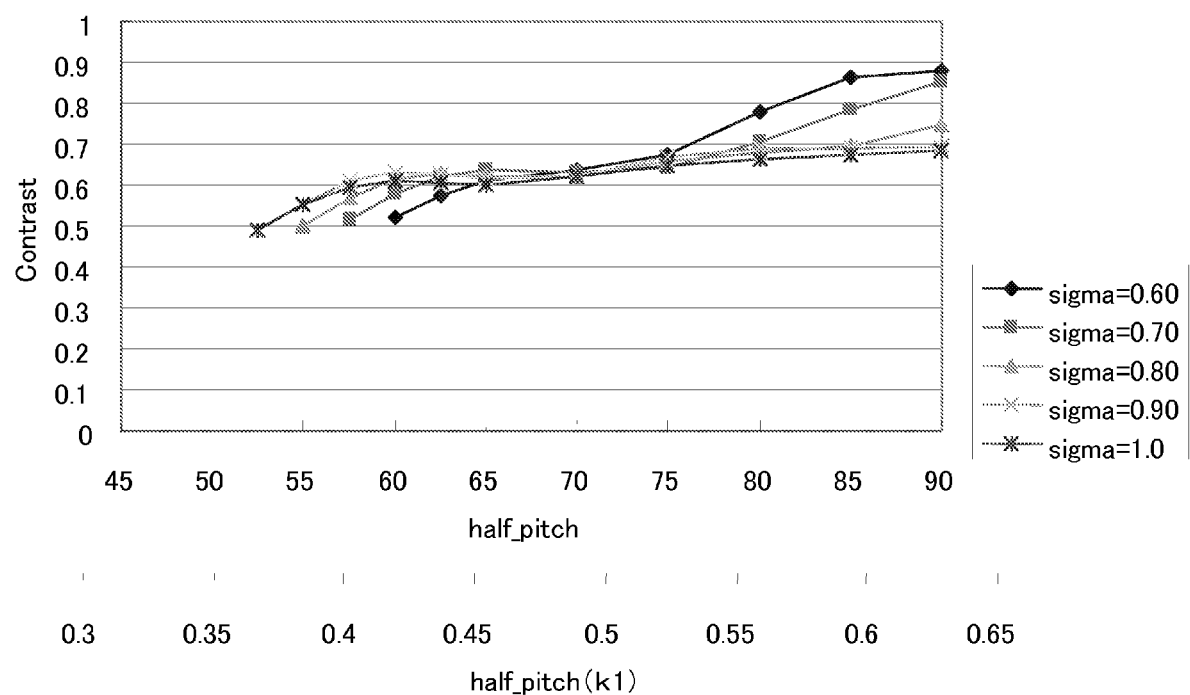
FIG. 8 is a graph of a relationship between a half pitch and a contract that depend on a σ in a first embodiment.
Figure 9:
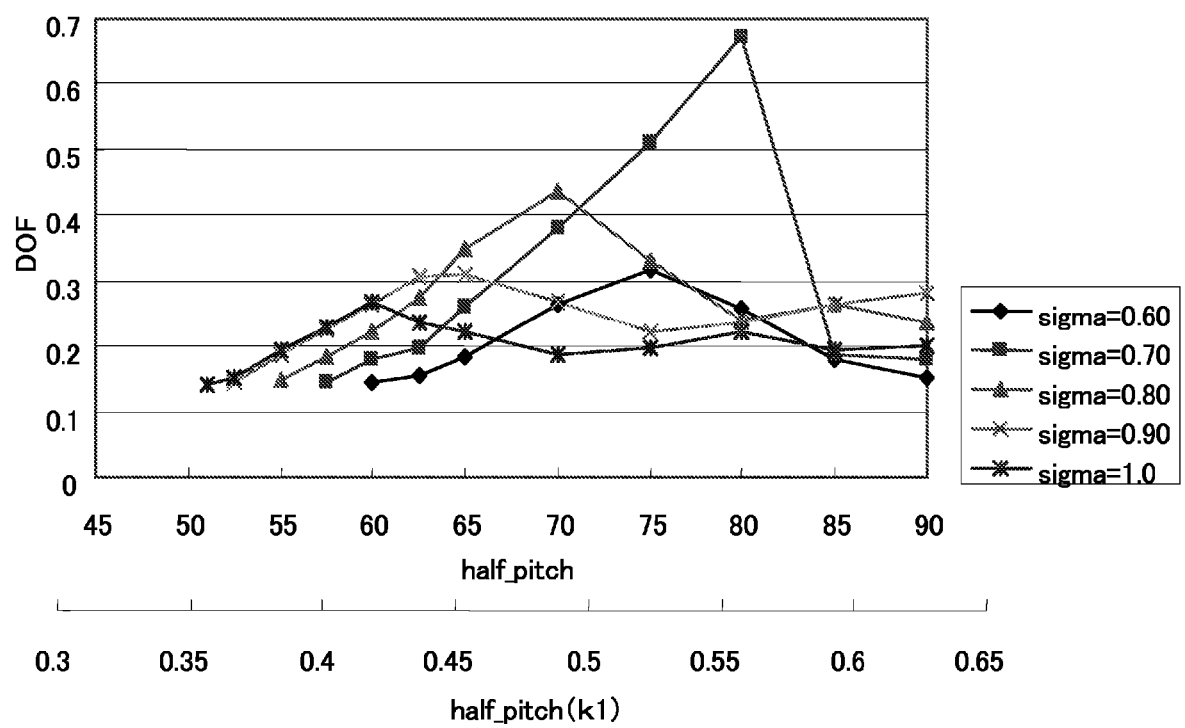
FIG. 9 is a graph of a relationship between a half pitch and a depth of focus that depend on a σ in a first embodiment.

Moreover, σr of the effective light source is fixed to 0.10, σ is use as a parameter and the change of the contrast was investigated changing the half pitch. The polarization direction is the radial polarization. FIG. 8 is a graph of this result. The contrast of 40% or more can be obtained until near 0.35 $k_1$ to finer half pitch. Similarly, σr of the effective light source is fixed to 0.10, σ is use as a parameter and the change of the depth of focus was investigated changing the half pitch. The polarization direction is the radial polarization. FIG. 9 is a graph of this result.

In exposure, an error of exposure dose and a focus setting error are not avoided, but the contact hole must be formed on the image plane within an error tolerance. Moreover, the contrast of 40% or more is required to expose the resist. The error of exposure dose is estimated to 5%, and a focus range that the size of the contact hole pattern on the image plane permits the change of less than 10% to a predetermined contact hole width and satisfies the contrast of 40% or more is defined as the practical depth of focus. In other words, if the predetermined contact hole width is W to the change of 5% of exposure dose, the focus range that the width of the contact hole on the image plane is 90% or more and 110% or less and satisfies the contrast of 40% or more is defined as the depth of focus. In three beam exposure, large depth of focus is obtained, and the depth of focus of 0.3 µm or more is obtained until near to 0.4 $k_1$ half pitch.

Even if the mask pattern is the same, unless the effective light source is suitable, the depth of focus is not obtained.

Figure 10:
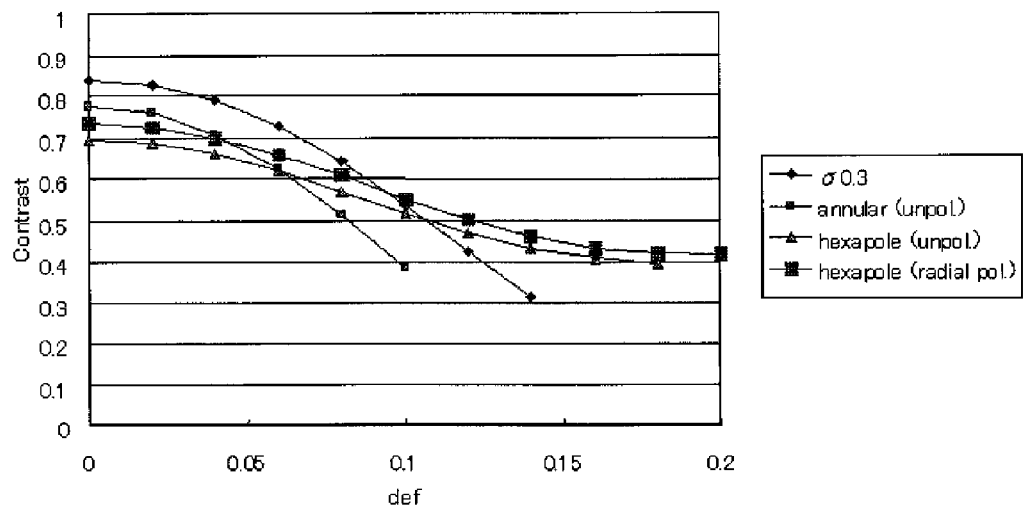
FIG. 10 is a graph of a relationship between a defocus and a contrast that compared a small σ and annular illumination with a hexapole illumination.
Figure 11:
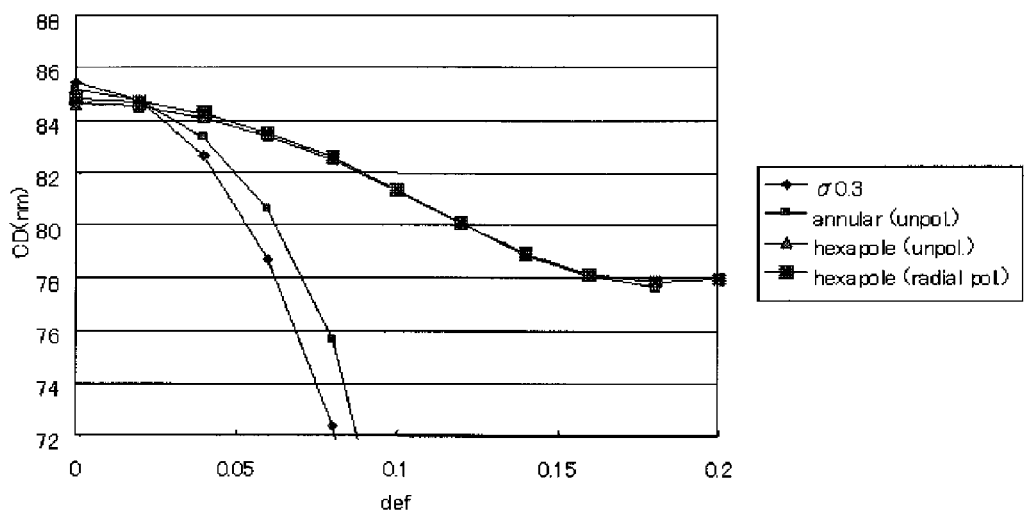
FIG. 11 is a graph of a relationship between a defocus and a CD that compared a small σ and annular illumination with a hexapole illumination.
Figure 18B:
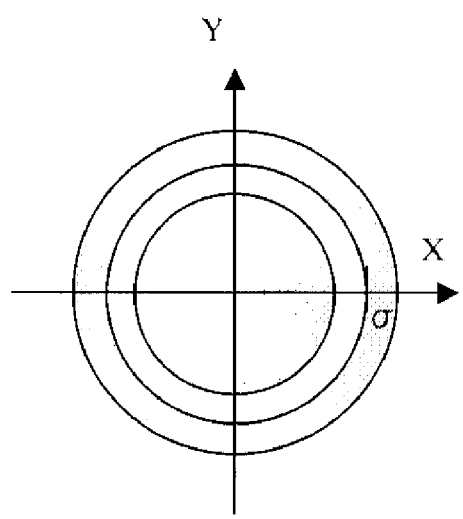
FIG. 18B is a schematic plane view of an annular effective light source shape.

A description will be given of a small σ illumination shown in FIG. 18A and an annular illumination shown in FIG. 18B as an example. The contact hole with W=80 (nm) and Px=Py=P=80 (nm) as shown in FIG. 4A is exposed using the exposure apparatus 100 (ArF excimer laser, NA=1.35). The effective light source uses the small σ illumination (σ=0.3) shown in FIG. 18A and the annular illumination (outside σ=0.65, inside σ=0.45) shown in FIG. 18B. Both are an unpolarized light illumination. These and a case that the contact hole is exposed using the hexapole illumination shown in FIGS. 2A and 3A are compared. The half pitch of the pattern is 80 nm ($k_1$=0.56). The illumination condition is outside σ=0.65, local σr=0.1, center position 1/(3.2*0.56)=0.55–. In this case, to the defocus, the contrast and the size of the contact hole (Critical Dimension: CD) change as shown in FIGS. 10 and 11. In the small σ illumination, although the most high contrast image is obtained, the focus range to obtain the contrast of 40% or more does not have even 0.2 µm, a CD change to the defocus is large, and the depth of focus is not obtained. The annular illumination obtains larger depth of focus than the small σ illumination but the depth of focus is smaller than 0.2 µm.

In the small σ illumination, since the light enters almost perpendicularly, seven lights of $0^{th}$ diffracted light and six $1^{th}$ diffracted lights interfere. Therefore, although the high contrast can be obtained in the best focus, the depth of focus cannot be obtained. In the annular illumination, the light enters by oblique incidence and three beam interfere. However, since three beam include many lights that are not symmetry to the center of the pupil, the degradation of the image to the defocus becomes large and the depth of focus is not obtained. On the other hand, in the hexapole illumination that includes three beam that are symmetry to the center of the pupil, the degradation of the image to the defocus is little, and large depth of focus is obtained.

Second Embodiment

The pitches in the longitudinal direction and the lateral direction are the same (Px=Py=P), and the contrast and the depth of focus is shown when the contact hole is imaged changing the pitches using the ArF excimer laser and the immersion exposure apparatus 100 with a NA of 1.35. The refractive index is about 1.44. The mask 130 uses the binary mask.

A change of the contrast by the polarization direction was investigated. The effective light source is the hexapole illumination as shown in FIG. 2A, σ is 0.80, and a size of a local light source is σr=0.10. The radial polarization shown in FIG. 3A, the tangential polarization shown in FIG. 3B and the unpolarized light are compared as the polarization.

Figure 12:
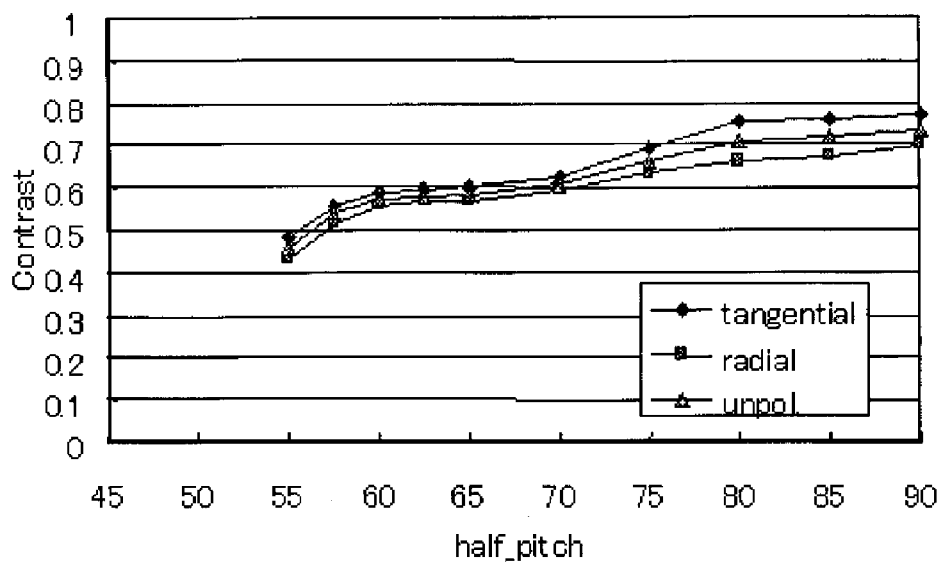
FIG. 12 is a graph of a relationship between a half pitch and a depth of focus that depend on a polarization state in a second embodiment.

FIG. 12 is a graph of this result. In FIG. 12, a lateral axis is the half pitch of the contact hole (nm), and a longitudinal axis is a contrast peak. The contact hole width W is W=P/2 and Px=Py=P. Referring to FIG. 12, the tangential polarization obtains high contrast in the binary mask. However, the difference of the polarization by the polarization is little. The same contrast when the radial polarization illuminates (polarization in the radial direction) the attenuated phase shift mask (FIGS. 7 and 8, etc.) is obtained by any polarization direction.

Figure 13:
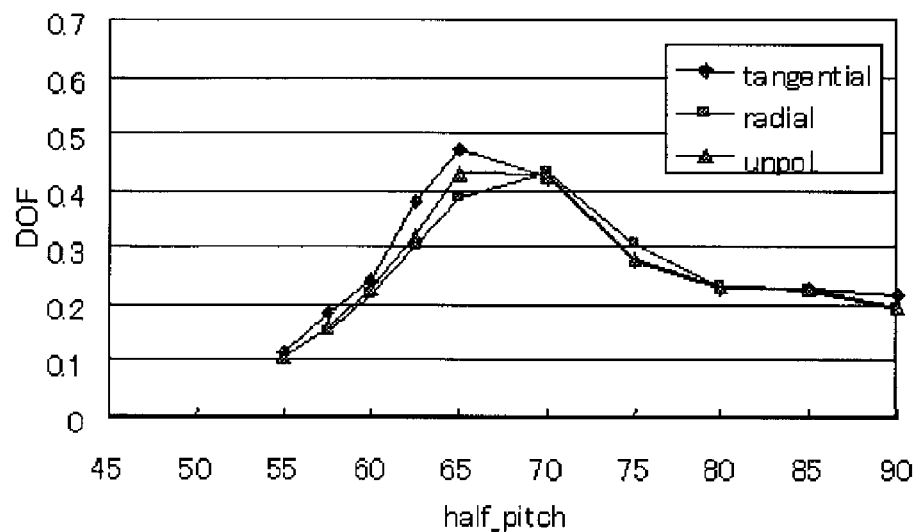
FIG. 13 is a graph of a relationship between a half pitch and a depth of focus that depend on a σ in a second embodiment.

Moreover, the effective light source is fixed to σ=0.80 and the size of the local light source is fixed to σr=0.10, and the change of the depth of focus was investigated changing the half pitch. The radial polarization, the tangential polarization and the unpolarized light are compared as the polarization. FIG. 13 is a graph of this result. In the binary mask, referring to FIG. 13, the tangential polarization obtains the depth of focus better than other polarization states in the fine half pitch. However, the difference of the depth of focus by the polarization direction is little. The depth of focus is almost same by any polarization direction.

Third Embodiment

Next, a description will be given of the depth of focus when the pitch of Py is determined to Py=√3Px/2. The contact hole width W is W=Px, and Py=√3Px/2. The contrast and the depth of focus is shown when the contact hole is imaged changing the pitches using the ArF excimer laser and the immersion exposure apparatus 100 with a NA of 1.35. The refractive index is about 1.44. The mask 130 uses the attenuated phase shift mask.

The effective light source is the hexapole illumination as shown in FIGS. 2A and 3A, and a size of a local light source is σr=0.10. The polarization is the radial polarization shown in FIG. 3A to obtain high contrast from the result of the first embodiment.

Figure 14:
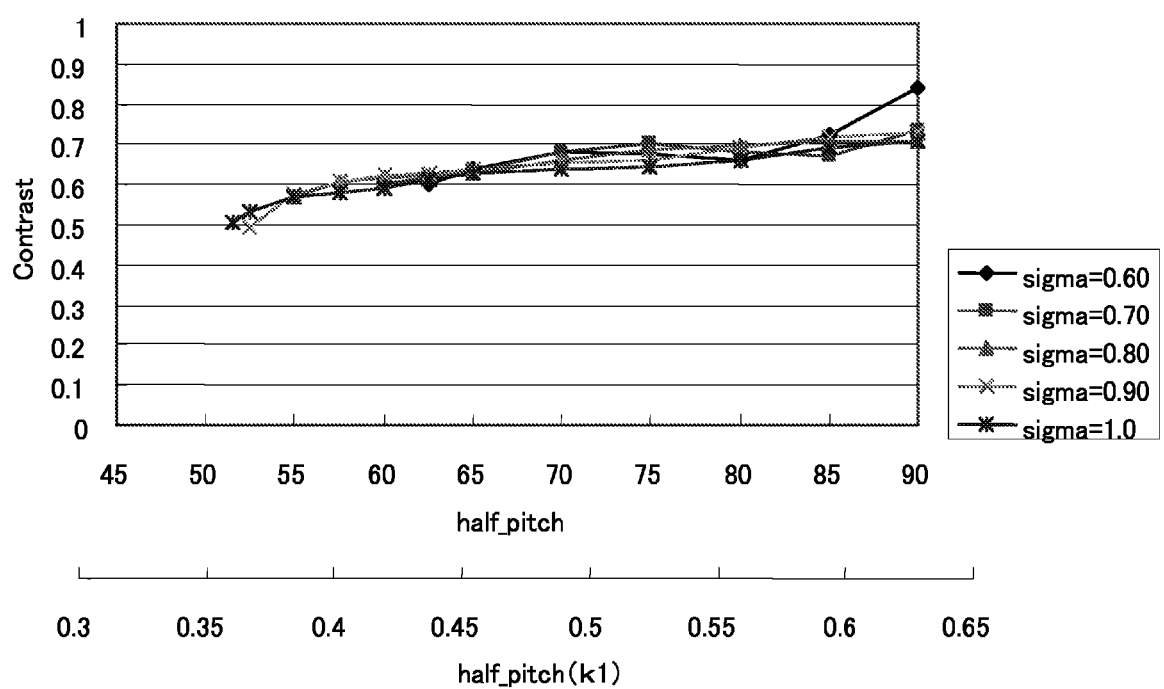
FIG. 14 is a graph of a relationship between a half pitch and a depth of focus that depend on a σ in a third embodiment.

In FIG. 14, σr of the effective light source is fixed to 0.10, σ is use as a parameter and the change of the contrast was investigated changing the half pitch. A lateral axis is the half pitch of the contact hole (nm), and a longitudinal axis is a contrast peak. The contrast of 40% or more can be obtained until near $0.35k_1$ to finer half pitch. The good contrast is obtained in the fine pitch than the result of the first embodiment.

Figure 15:
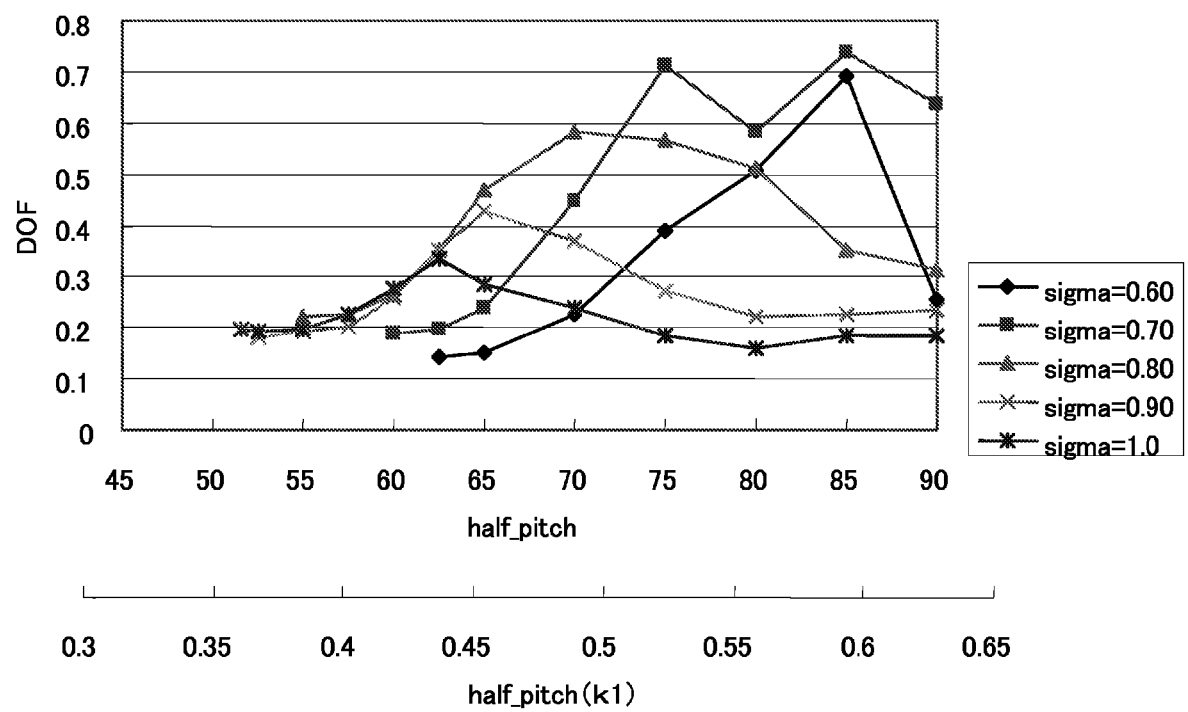
FIG. 15 is a graph of a relationship between a half pitch and a depth of focus that depend on a σ in a third embodiment.

Similarly, σr of the effective light source is fixed to 0.10, σ is use as a parameter and the change of the depth of focus was investigated changing the half pitch. FIG. 15 is a graph of this result. The polarization direction is the radial polarization. Three light exposure obtains large depth of focus and obtains the depth of focus of 0.3 μm or more until near $0.35k_1$ to finer half pitch. The larger depth of focus than the first embodiment can be obtained.

Fourth Embodiment

The instant embodiment uses the attenuated phase shift mask as the mask 130, and exposes the isolated contact hole CH. In the isolated contact hole $CH_1$ the auxiliary pattern AP is arranged around the hole so that the triangle is formed and six auxiliary patterns AP are arranged in the isolated hole. As shown in FIGS. 23A to 23E, the auxiliary pattern AP is sequentially added around the isolated contact hole CH so that the auxiliary pattern AP forms the triangle. An auxiliary pattern is placed symmetrical to the target pattern. Then, the six auxiliary patterns AP are inserted around the isolated contact hole pattern CH as shown in FIG. 22.

Figure 22:
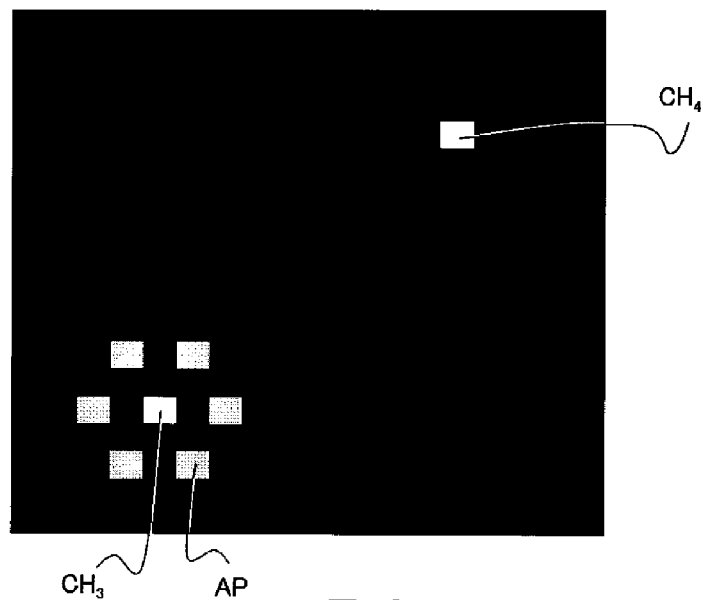
FIG. 22 is a schematic plane view of a mask pattern that inserted the auxiliary pattern in a fourth embodiment.
Figure 23A:
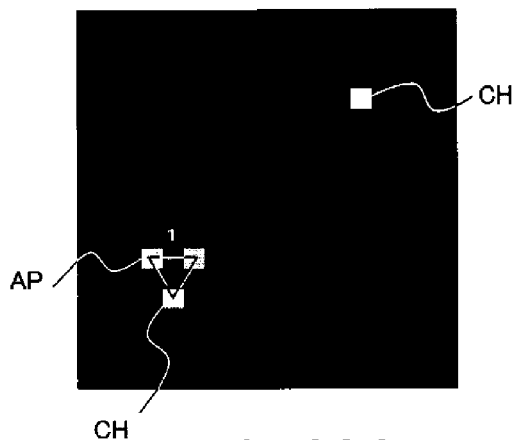
FIGS. 23A to 23E are schematic plane view for explaining a forming process of the mask pattern shown in FIG. 22.
Figure 23B:
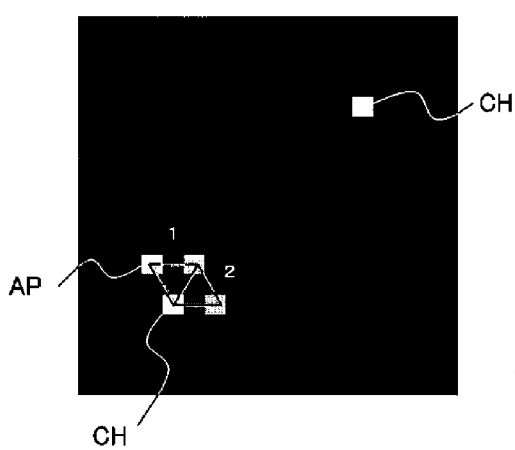
Figure 23C:
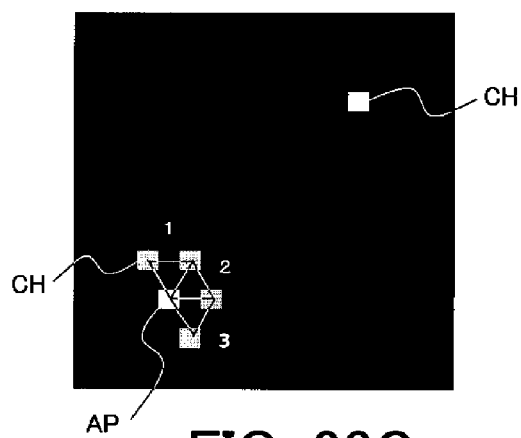
Figure 23D:
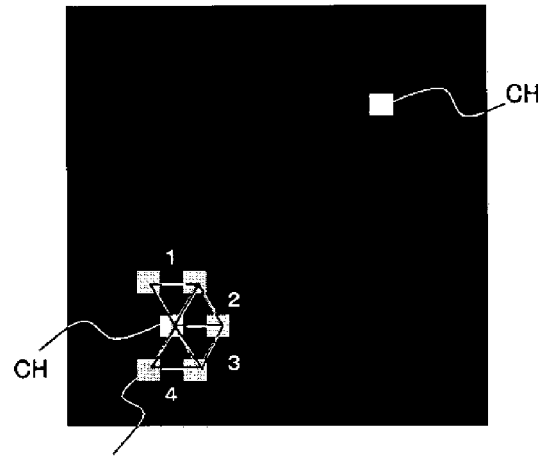
Figure 23E:
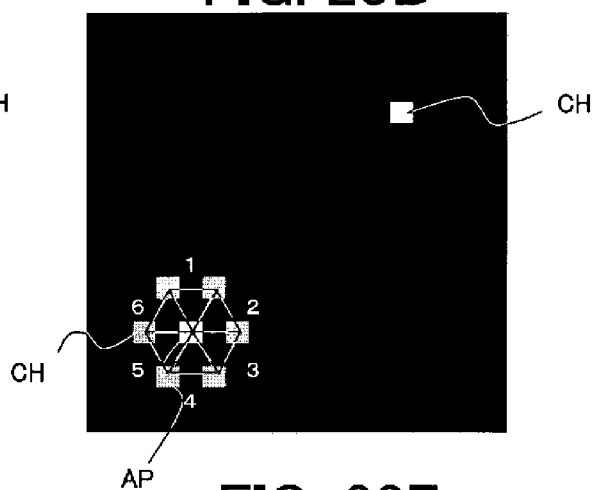

An isolated contact hole pattern $CH_4$ that does not have the auxiliary pattern shown in the upper right of FIG. 22 is compared with an isolated contact hole pattern $CH_3$ that has six auxiliary patterns AP shown in the lower left of FIG. 22. A size of the auxiliary pattern AP is a width s. If the pitch in the lateral direction is Px and the pitch in the longitudinal direction is Py, then Px is set to $0.33<k_1<0.67$ using $k_1$ as the half pitch of the pattern (Px/2) and Py is set to Py=3Px/2. CH shows $CH_3$ and $CH_4$.

The isolated contact hole CH with a size of W=72 (nm), the isolated contact hole CH with a size of 79 (nm), the isolated contact hole CH with a size of 86 (nm) and the isolated contact hole CH with a size of 100 (nm) are resolved at the same time. Since only the isolated contact hole CH exists, the half pitch of the auxiliary pattern AP is arbitrary in the range of $0.33<k_1<0.67$. However, a constant half pitch is set irrespective of the size of the isolated contact hole CH to set the optimal exposure condition. In this case, all half pitches are set to P/2=72 (nm).

Figure 24:
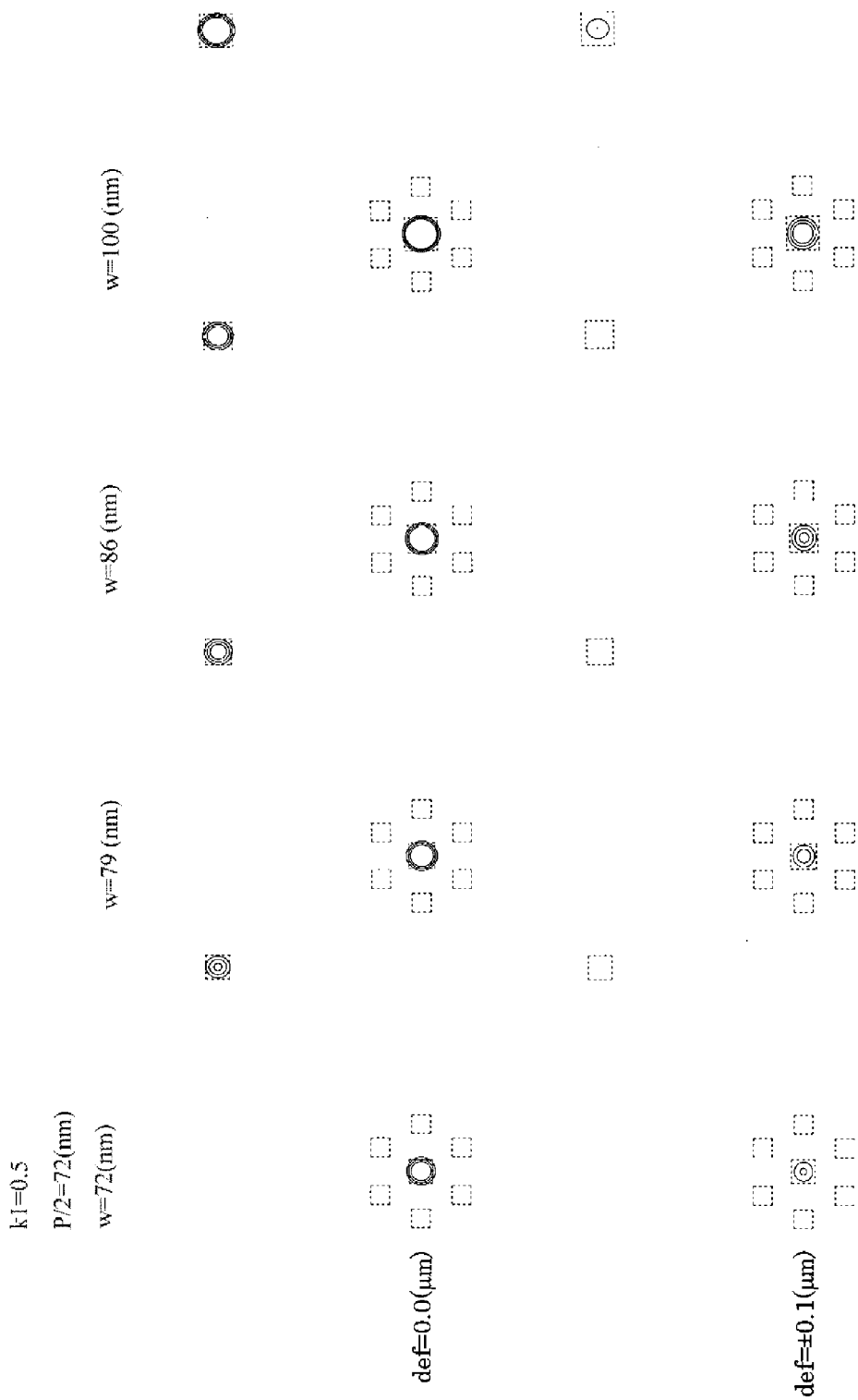
FIG. 24 is a view of a resolution result of the mask pattern shown in FIG. 22.

The ArF excimer laser and the immersion exposure apparatus 100 with a NA of 1.35 are used, and the half pitch is $k_1=0.5$ using $k_1$. The effective light source is the hexapole illumination as shown in FIGS. 2A and 3A, and a size of a local light source is σr=0.10. The polarization is the radial polarization shown in FIG. 3A to obtain high contrast from the result of the first embodiment. The center position of hexapole is $1/(3k_1)=0.67$. All sizes of auxiliary patterns S are the same, and are 0.8 times of the half pitch, in other words, S=0.80·P/2=58 (nm). FIG. 24 shows a result of a two-dimension intensity distribution in this case, and shows intensity with a predetermined intensity and a level contour line of ±20% to its intensity. In FIG. 24, an upper shows the best focus and a lower shows ±0.1 μm defocus.

The contrast of the isolated contact hole $CH_3$ is better than the contrast of the isolated contact hole $CH_4$, and the hole pattern is also obtained in the defocus. Therefore, the holes of these different sizes are formed in the depth of focus to 0.2 μm. Thus, the size of the auxiliary pattern AP is 0.6 times to 0.8 times of the half pitch of the auxiliary pattern AP or 0.6 times to 0.8 times of the isolated contact hole pattern CH. However, when the isolated contact hole patterns CH with different sizes are exposed at the same time, all half pitches of the auxiliary patterns AP may be set to the same and the size of the auxiliary pattern AP may be set to 0.6 times to 0.8 times of the half pitch of the auxiliary pattern AP. When the size of the hole pattern differs, the size is corrected so that the size becomes the predetermined size in the same exposure dose.

Fifth Embodiment

Figure 25:
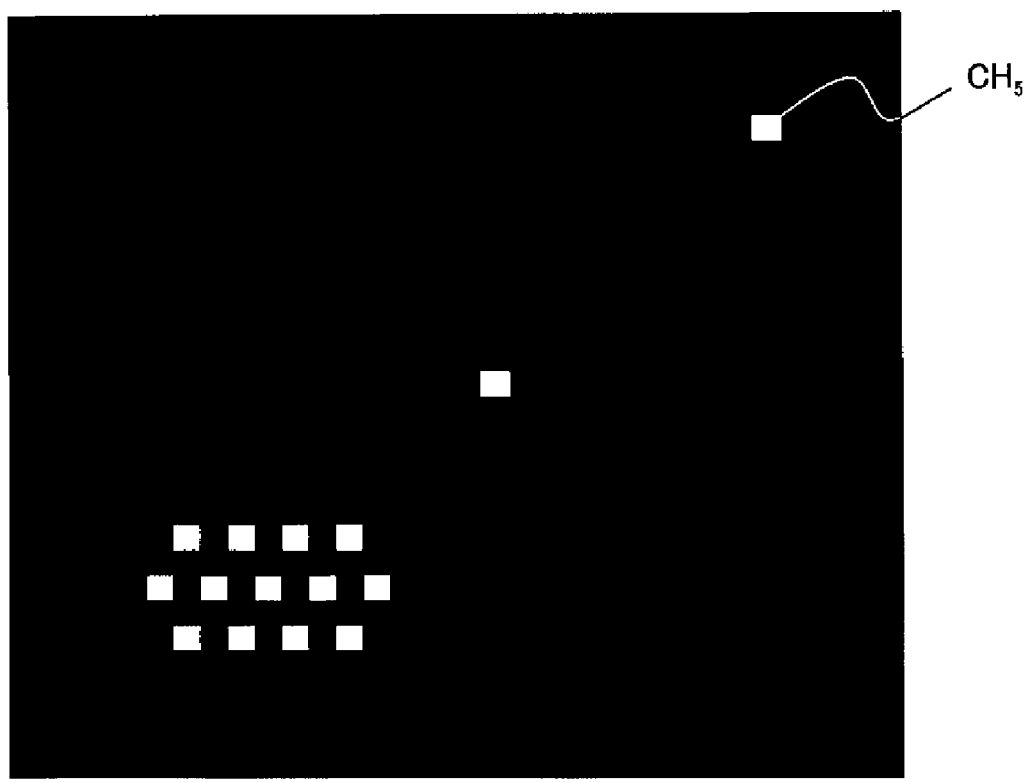
FIG. 25 is a schematic plane view of a target pattern in a fifth embodiment.

The instant embodiment uses the attenuated phase shift mask as the mask 130 and the isolated pattern and dense pattern are included as shown in FIG. 25. an isolated pattern $CH_5$ does not includes the auxiliary pattern to compare. an arrangement of the auxiliary pattern AP as shown in FIG. 25 can be considered. When the auxiliary pattern cannot be arranged since target pattern and other pattern are close, the auxiliary pattern is arranged around the target pattern so that the triangle is formed as shown in FIGS. 21A to 21D. The pitches Px and Py of the auxiliary pattern AP are accorded with the minimum pitch of the dense pattern.

The auxiliary pattern is arranged around the outer hole in the dense pattern so that the triangle is formed, similarly the isolated hole.

The size is corrected so that dense hole and isolated hole becomes same size in the same exposure dose.

In the dense hole, if the size is corrected so that a center and outer hole become same size in the same exposure dose, an uniformity of the size of the congestion pattern becomes still better. However, the size of the outer-hole is not corrected in the instant embodiment.

Figure 26:
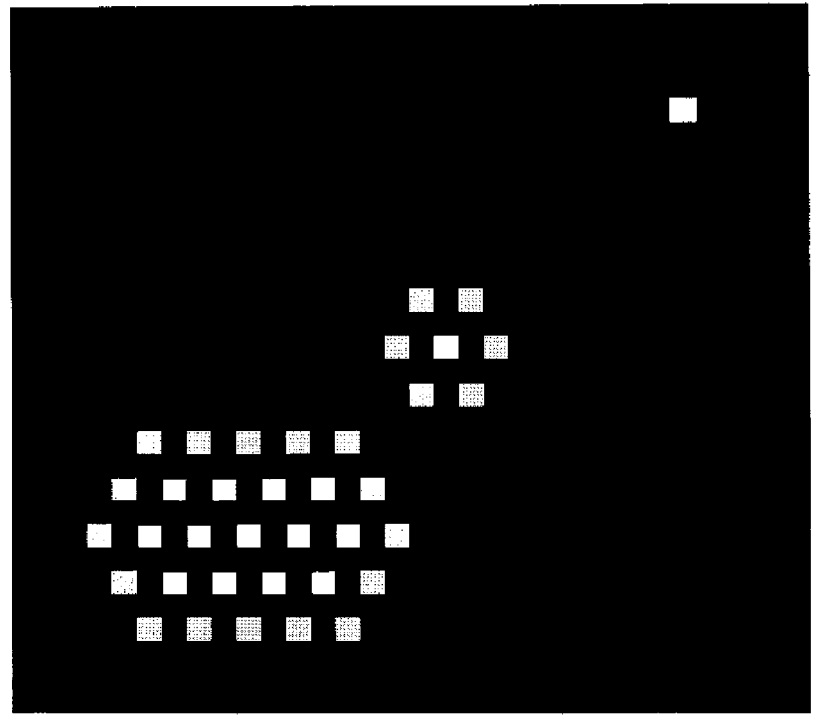
FIG. 26 is a schematic plane view of a mask pattern that inserted an auxiliary pattern in the pattern shown in FIG. 25.
Figure 27:
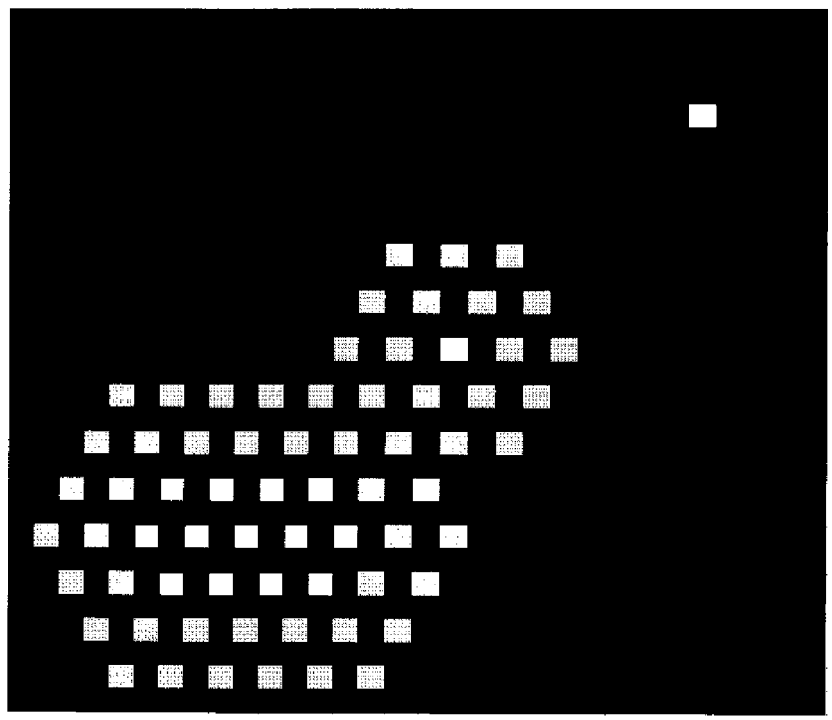
FIG. 27 is a schematic plane view of a mask pattern that inserted another auxiliary pattern in the pattern shown in FIG. 25.

The exposure result of hole with w=72 (nm) and half pitch (Px/2) of 72 (nm) is shown using the mask pattern of FIG. 26 as the target pattern of FIG. 25. The half pitch of the auxiliary pattern is set to the same as the half pitch (Px/2=72, Py=√3Px/2) of the dense pattern. Although the size of the hole of the dense pattern is 72 (nm), the size of the isolated hole is set to Wi=72*1.06=76 (nm) and the width of the auxiliary pattern is set to S=Wi*0.75=57 (nm) so that the size of the hole of the dense pattern is the same as the size of the isolated hole. In this case, the exposure condition is the same as the fourth embodiment.

Figure 28A:
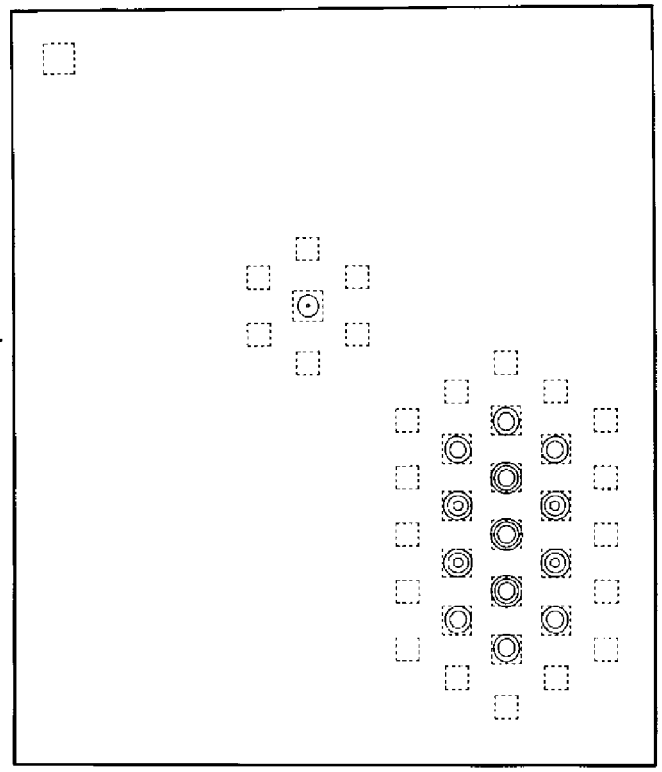
FIG. 28 is a view of a resolution result of the pattern shown in FIG. 26.
Figure 28B:
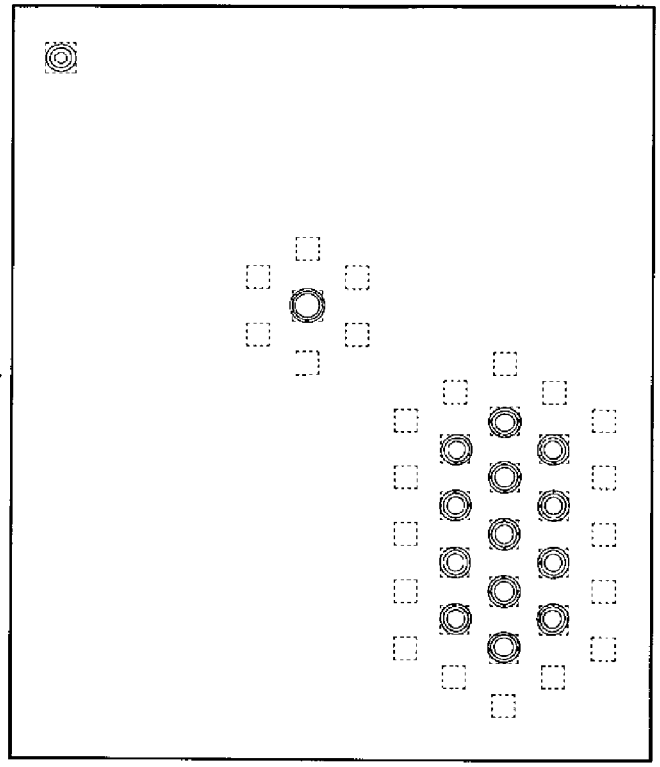

FIG. 28 shows a two-dimension intensity distribution as an exposure result, and shows intensity with a predetermined intensity and a level contour line of ±20% to its intensity. The size of the hole of the dense pattern and the isolated hole becomes uniformly, and it is resolved in ±0.1 μm defocus shown in right side.

Next, the exposure result of further fine hole with w=65 (nm) and half pitch (Px/2) of 65 (nm) is shown using the mask pattern of FIG. 26 as the same target pattern of FIG. 25. Although the size of the hole of the dense pattern is 65 (nm), the size of the isolated hole is set to Wi=65*1.20=78 (nm) and the width of the auxiliary pattern is set to S=Wi*0.75=58 (nm) so that the size of the hole of the dense pattern is the same as the size of the isolated hole. If it is exposed by the ArF excimer laser and the immersion exposure apparatus with a NA of 1.35, the half pitch becomes $k_1$=0.45 using $k_1$ as the half pitch. The effective light source is the hexapole illumination as shown in FIGS. 2A and 3A, and a size of a local light source is σr=0.10. The polarization is the radial polarization shown in FIG. 3A to obtain high contrast from the result of the first embodiment. The center position of the hexapole is $1/(3k_1)$=0.74.

Figure 29A:
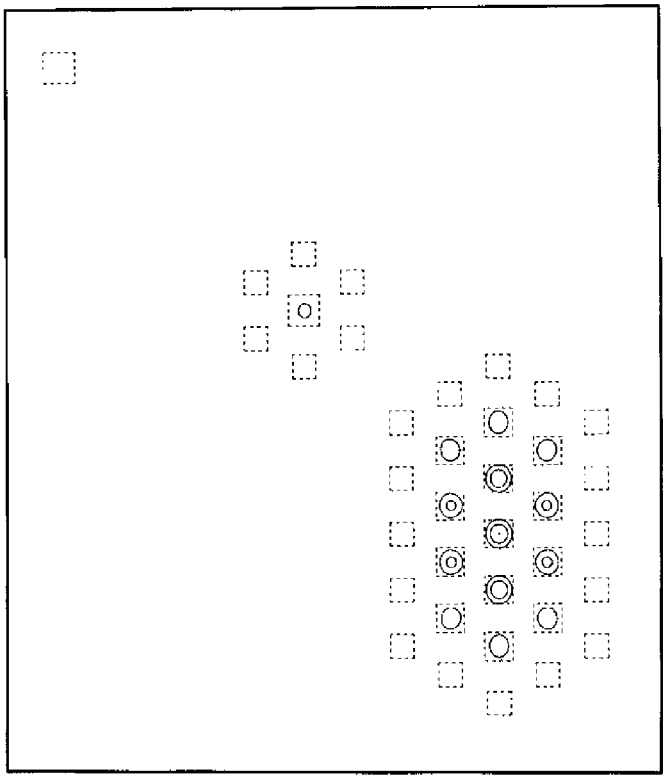
FIG. 29 is a view of a resolution result of the pattern shown in FIG. 26 by a different exposure condition.
Figure 29B:
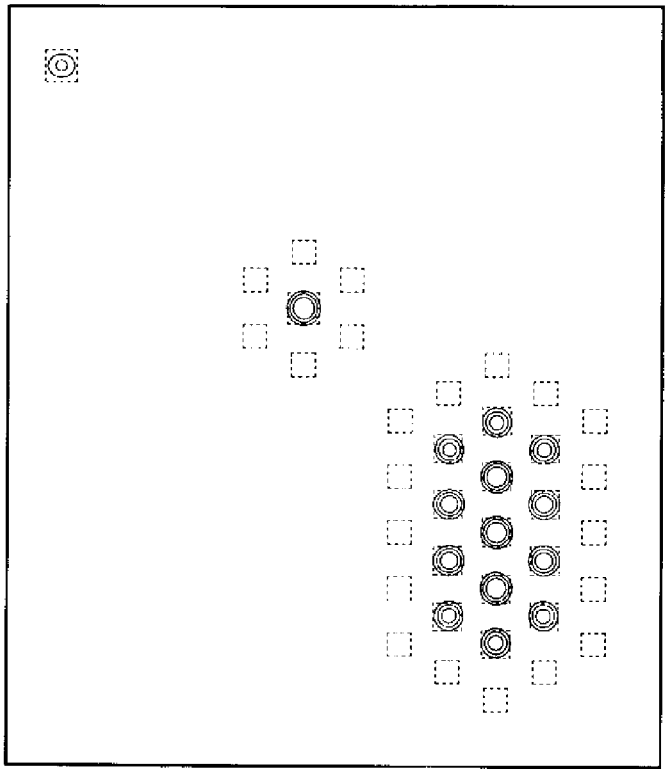

FIG. 29 shows a two-dimension intensity distribution as an exposure result. The size of the hole of the dense pattern and the isolated hole becomes uniformly, and it is resolved in ±0.1 μm defocus shown in right side.

In the arrangement of the auxiliary pattern, if an insertion space exists between patterns, the auxiliary pattern may enclose twice the target pattern as shown in FIG. 26.

If Px is half pitch (Px/2=65, Py=√3Px/2) of the dense pattern in the hole with w=65 (nm) as shown in FIG. 25, although the size of the hole of the dense pattern is 65 (nm), the size of the isolated hole is set to Wi=65*1.15=75 (nm) and the width of the auxiliary pattern is set to S=Wi*0.70=52 (nm) so that the size of the hole of the dense pattern is the same as the size of the isolated hole. Thereby, the almost same result as FIG. 29 can be obtained. When the auxiliary pattern is doubly arranged around the target pattern, as compared with the case that the auxiliary pattern is singly arranged around the target pattern, the correction of the size of the isolated hole can be slight small and the width of the auxiliary pattern can be slight small. When the auxiliary pattern is doubly arranged around the target pattern, the exposure result becomes somewhat good if the pattern is fine. However, even when the auxiliary pattern is singly arranged around the target pattern, the expansion effect of resolution and depth of focus can be obtained if the width of the auxiliary pattern and the size of the isolated pattern are corrected to the optimal.

Sixth Embodiment

Figure 30A:
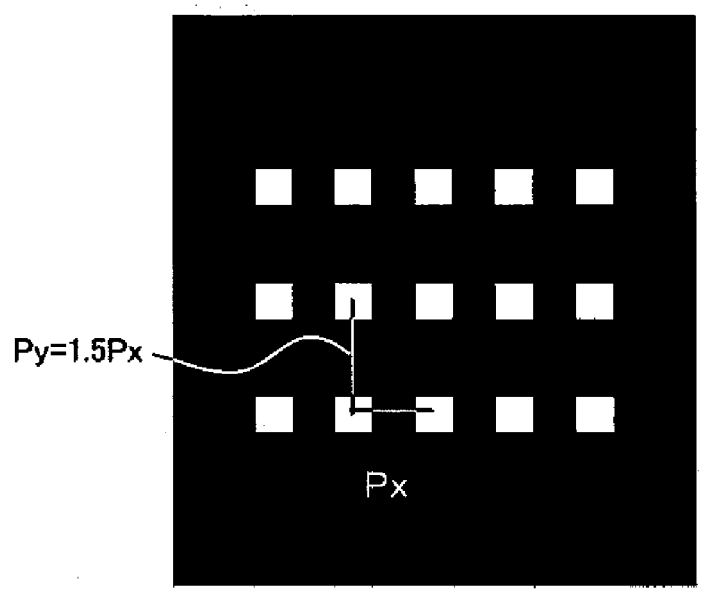
FIG. 30A is a schematic plane view of a target pattern in a sixth embodiment.

Next, a description will be given of a manufacturing method of a checker pattern by inserting the auxiliary pattern. A tessellated pattern as shown in FIG. 30A is Py=1.5 Px if a pitch in Y direction is Py and a pitch in X direction is Px. In this case, since the pitch in Y direction is a forbidden pitch, the depth of focus cannot be obtained. The effect is achieved by inserting the auxiliary pattern to such pattern as shown in FIG. 30B.

Figure 30B:
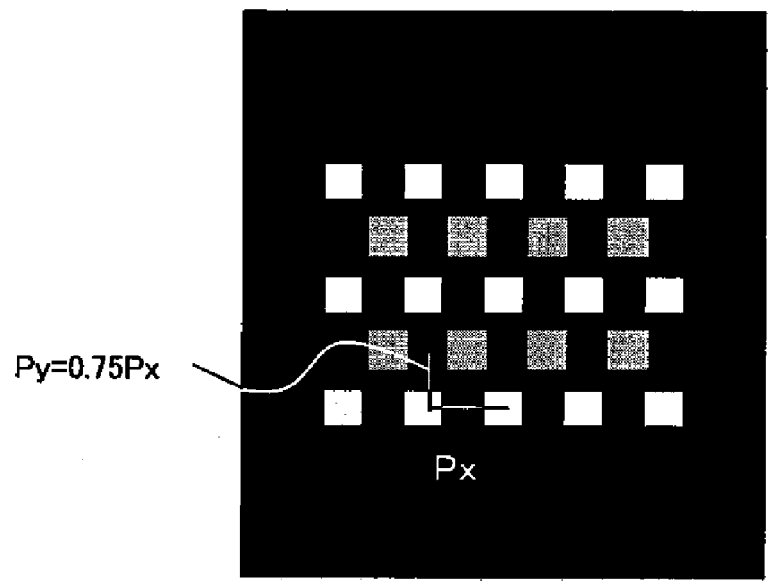
FIG. 30B is a schematic plane view of a mask pattern of checker that inserted an auxiliary pattern in the pattern shown in FIG. 30A.
Figure 31:
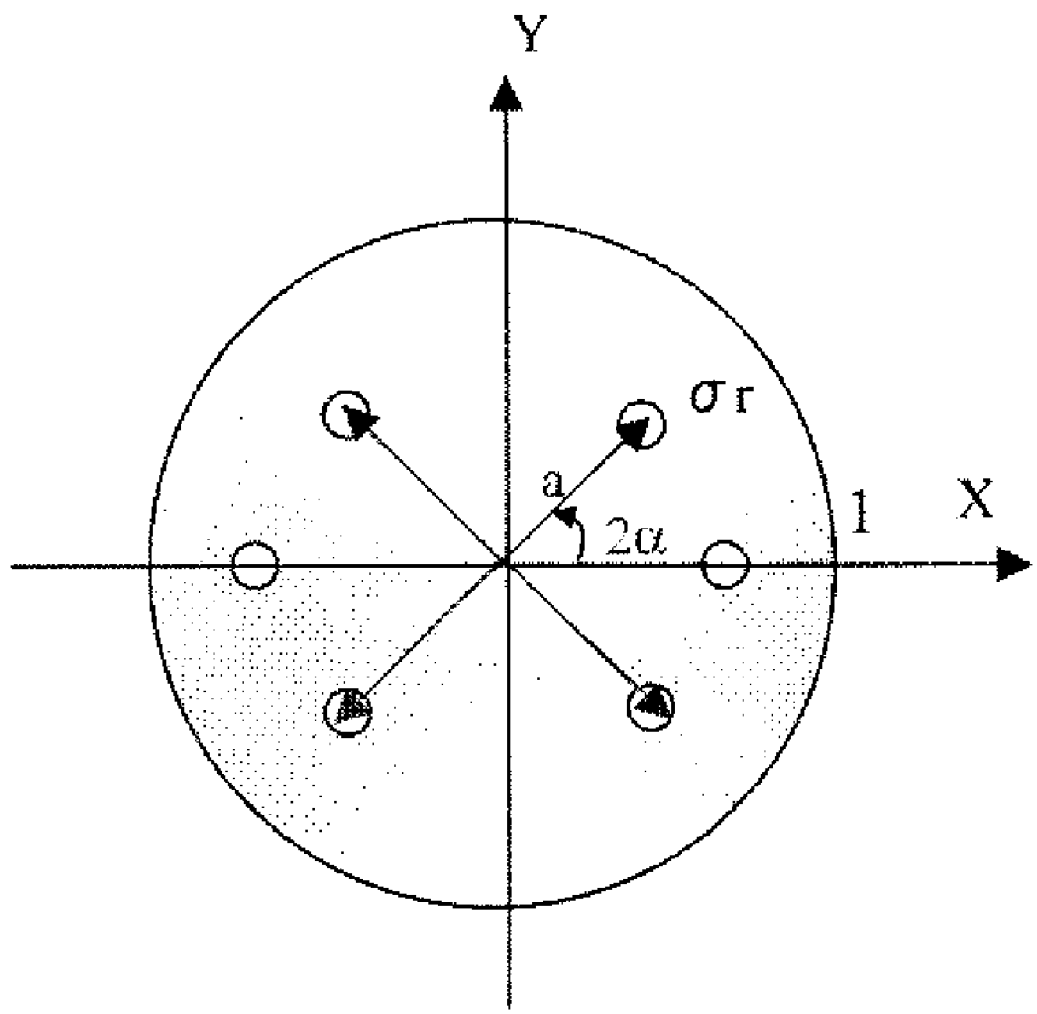
FIG. 31 is a schematic plane view of an effective light source shape to expose the mask pattern shown in FIG. 30B.

In FIG. 30B, white shows the target pattern and gray shows the auxiliary pattern.

An auxiliary pattern is placed at the distance of Py=0.75Px in the y direction, and at the distance of half-pitch (0.5 px) in the x direction from a target pattern.

Figures 32A, 32B:
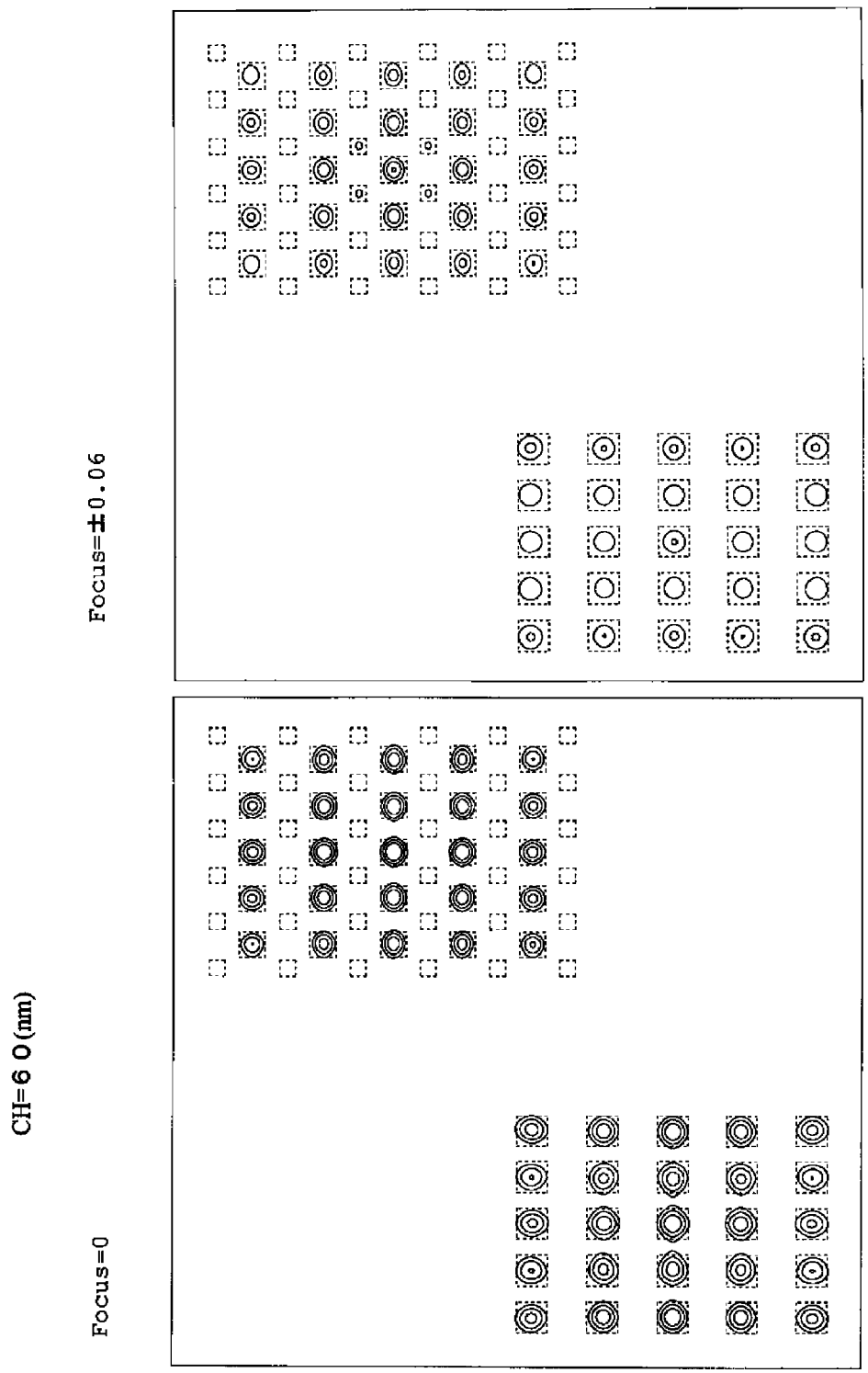
FIG. 32A is a view of an exposure result of the mask pattern shown in FIG. 30B at a best focus.
FIG. 32B is a view of an exposure result of the mask pattern shown in FIG. 30B at a defocus.

The mask uses the attenuated phase shift mask, and the size of the contact hole is 60 nm, Px=120 nm, and Py=120*1.5=180 nm. The width of the auxiliary pattern is 60*0.67=40 (nm). The exposure result in the same exposure condition is shown. (that is the ArF excimer laser and the immersion exposure apparatus with a NA of 1.35) The illumination condition is the hexapole illumination and is a=0.86, 2α=2 $\tan^{-1}$(1/1.5)=67.4°. A size of a local light source is σr=0.10. The polarization is the radial polarization. FIGS. 32A and 32B shows a two-dimension intensity distribution as the exposure result, and shows intensity with a intensity and a level contour line of ±20% to its intensity. The half pitch in X direction of 60 nm is $k_1$=0.42 using $k_1$.

A pattern of an upper right of FIGS. 32A and 32B is an exposure result of the pattern that includes the auxiliary pattern as shown in FIG. 30B, and a pattern of an lower left of FIGS. 32A and 32B is an exposure result of the pattern that does not include the auxiliary pattern as shown in FIG. 30A. These patterns are exposed at the same time. Actually, the hole of the pattern of the lower left is bias-corrected so that the size of the pattern after development becomes the same. FIG. 32A shows the result in best focus, and FIG. 32B shows the result in ±0.06 μm defocus. The contrast of the pattern that includes the auxiliary pattern (the pattern of the upper right) is better than the contrast of the pattern that does not include the auxiliary pattern (the pattern of the lower left) in best focus and defocus.

Figure 33A:
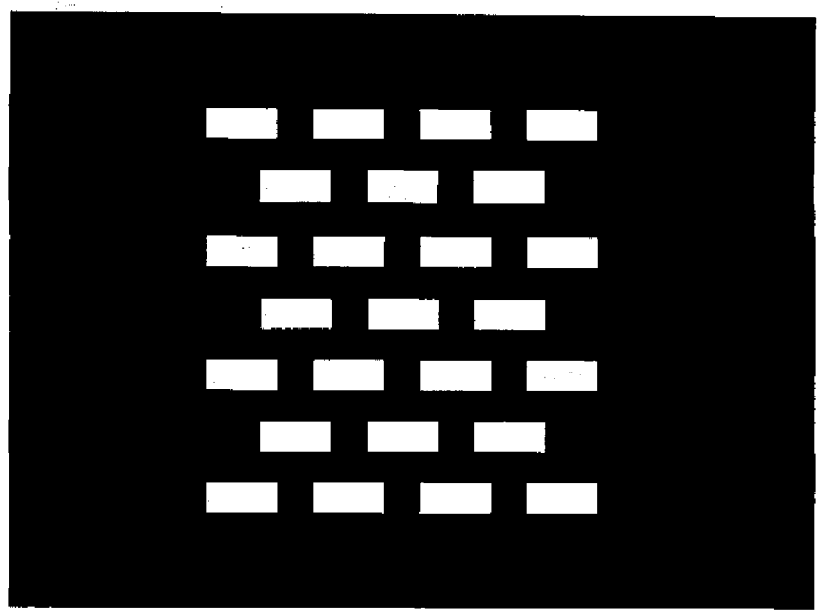
FIG. 33A is a schematic plane view of another target pattern in a sixth embodiment.
Figure 33B:
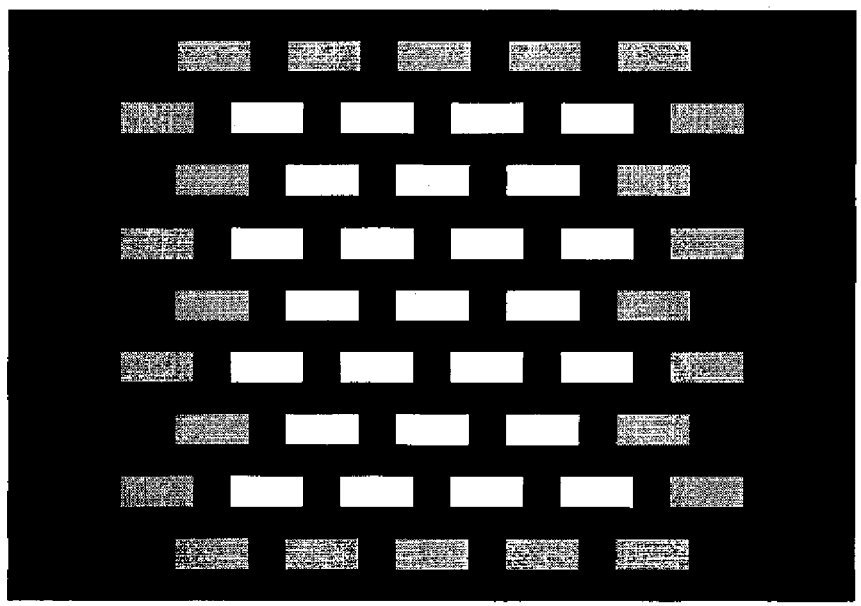
FIG. 33B is a schematic plane view of a mask pattern of checker that inserted an auxiliary pattern in the pattern shown in FIG. 33A.
Figure 34:
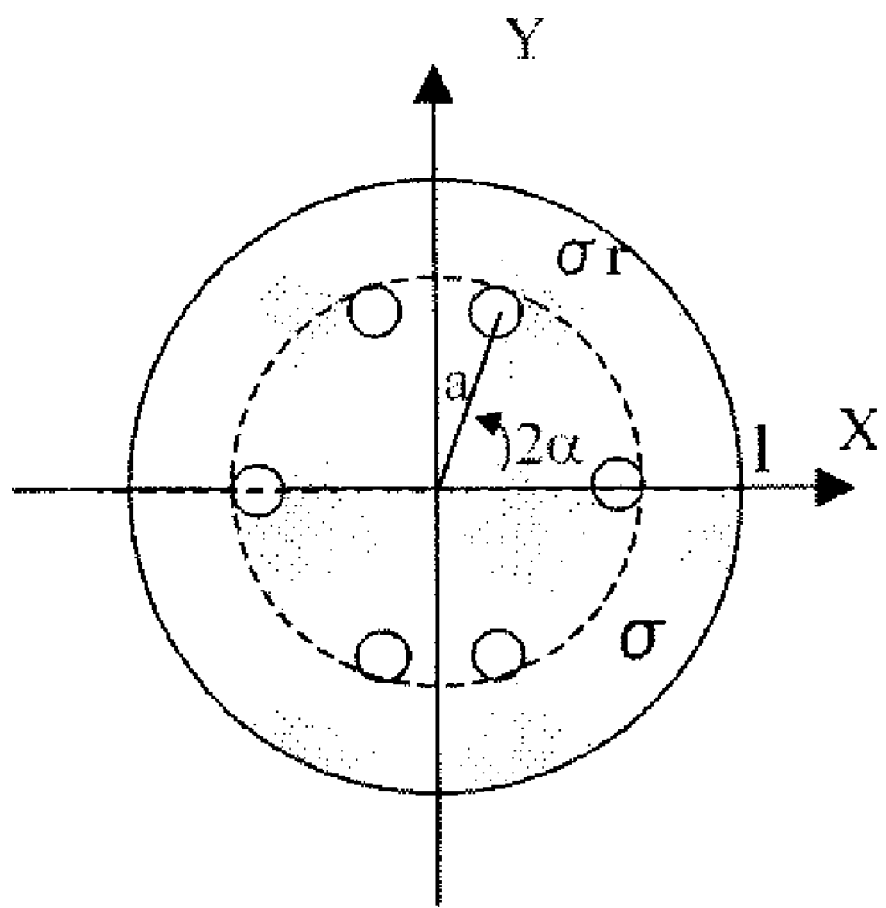
FIG. 34 is a schematic plane view of an effective light source shape to expose the mask pattern shown in FIG. 33B.
Figure 35B:
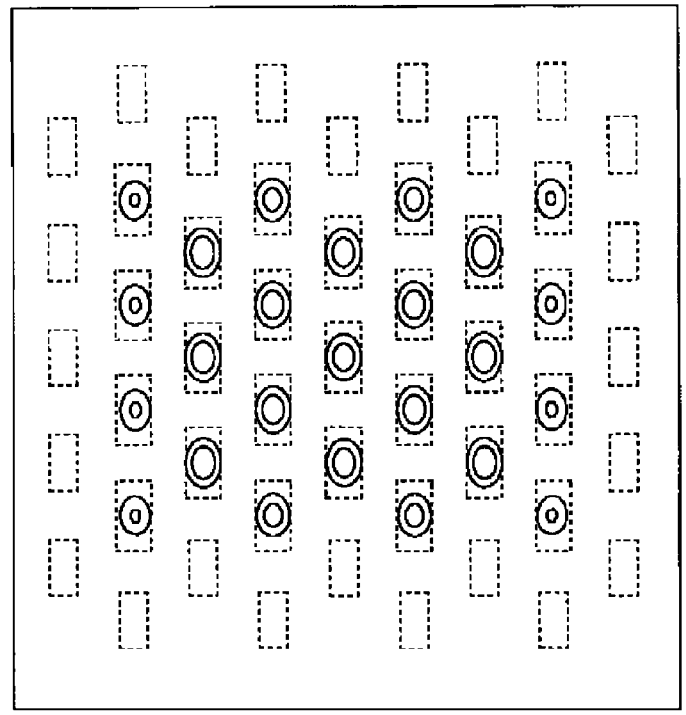
FIG. 35B is an exposure result of the mask pattern shown in FIG. 33B at a defocus.
Figure 35A:
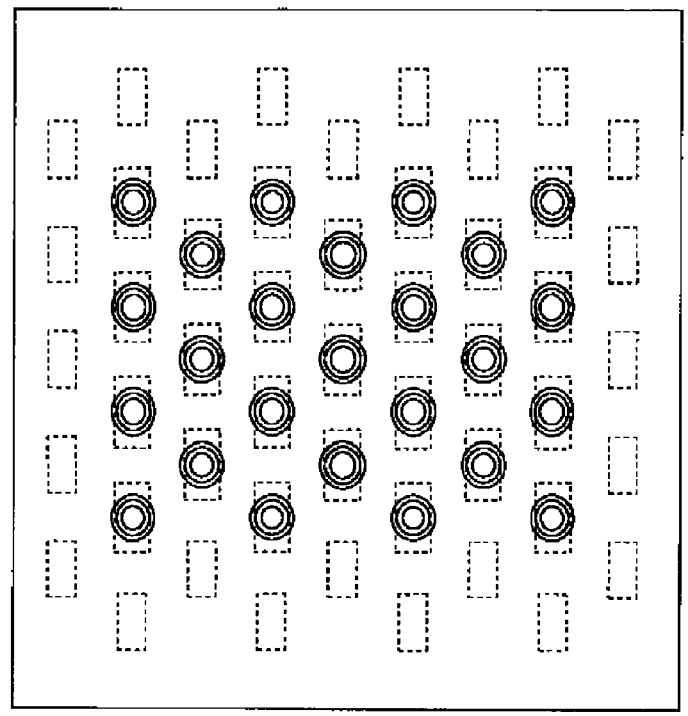
FIG. 35A is a view of an exposure result of the mask pattern shown in FIG. 33B at a best focus.

The effect is achieved also to a hole that has different aspect ratio as shown in FIG. 33A. The aspect ratio of 2 is not special, but is merely illustrative in addition to 1. In the size of the contact hole, the width in X direction is 130 nm, the width in Y direction is 65 nm and an interval of X and Y directions is 65 nm, the pitch is Px=195 nm and Py=130 nm. If the auxiliary pattern is inserted, it becomes the pattern as shown in FIG. 33B. The width of the auxiliary pattern in X direction is 130 nm*0.8=104 nm, and the width of the auxiliary pattern in Y direction is 65 nm*0.8=52 nm. In the same exposure condition, the half pitch in Y direction of 65 nm is $k_1$=0.45 using $k_1$. The illumination condition is the hexapole illumination as shown in FIG. 34 and is a=0.58, $2\alpha=2\tan^{-1}(1/1.5)=73.70°$. A size of a local light source is σr=0.10. The polarization is unpolarized light. The exposure result by the ArF excimer laser and the immersion exposure apparatus with a NA of 1.35 is shown. FIGS. 35A and 35B shows a two-dimension intensity distribution as the exposure result, and shows intensity with a predetermined intensity and a level contour line of ±20% to its intensity. FIG. 35A shows the result in best focus, and FIG. 35B shows the result in ±0.10 μm defocus. The contrast is good in best focus and defocus, and the depth of focus of about 0.2 μm is obtained. In this case, since the polarization is unpolarized light. An illumination of the attenuated phase shift mask with a radial polarization would improve the contrast.

Figure 36A:
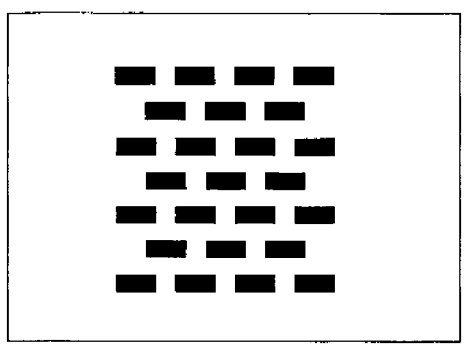
FIG. 36A is a schematic plane view of further another target pattern in a sixth embodiment.
Figure 36B:
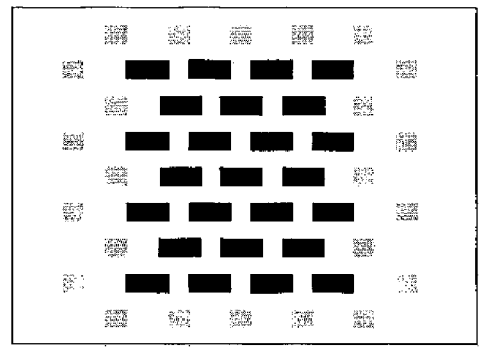
FIG. 36B is a schematic plane view of a mask pattern of checker that inserted an auxiliary pattern in the pattern shown in FIG. 36A.
Figure 37A:
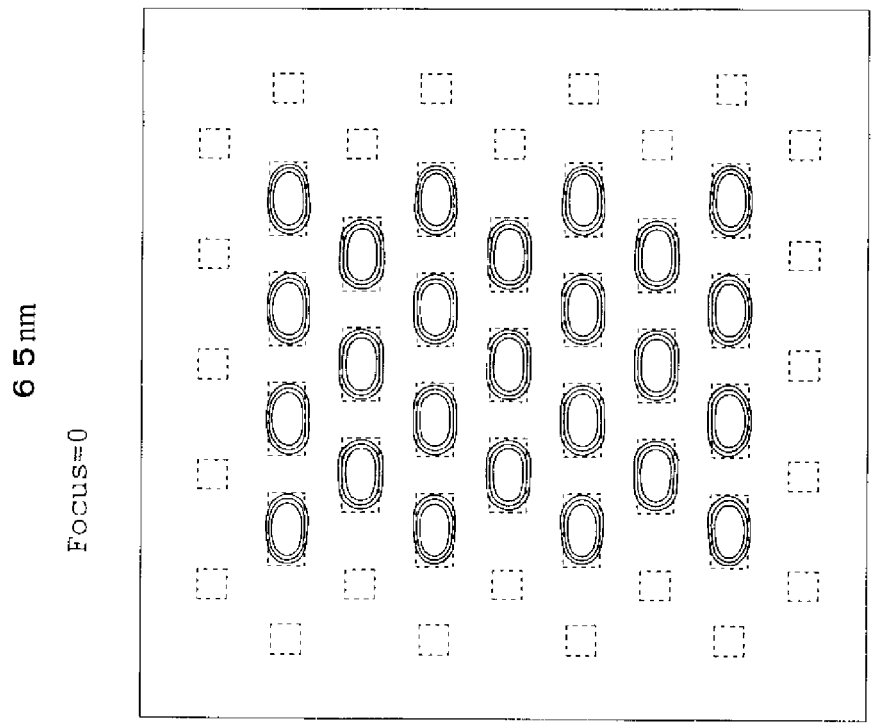
FIG. 37A is a view of an exposure result of the mask pattern shown in FIG. 36B at a best focus.
Figure 37B:
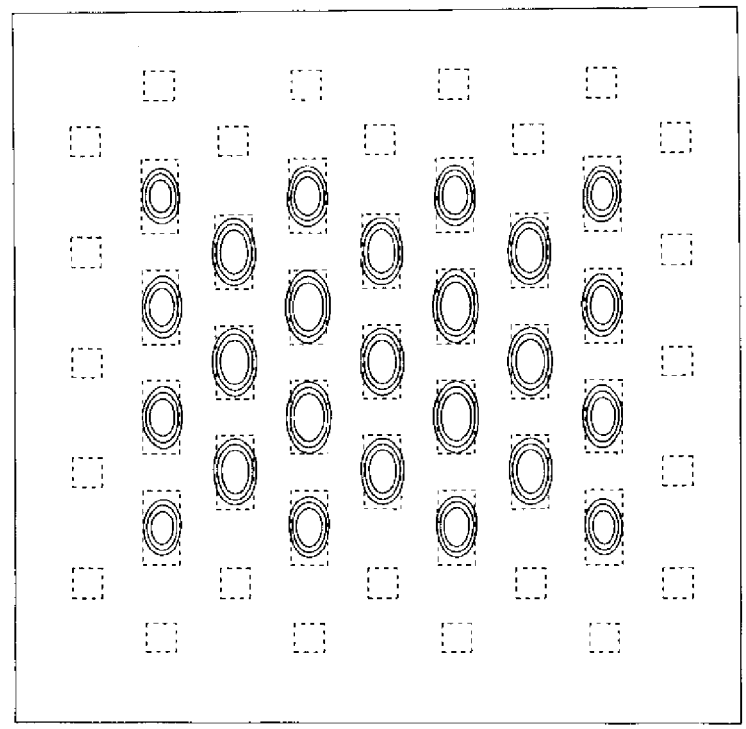
FIG. 37B is a view of an exposure result of the mask pattern shown in FIG. 36B at a defocus.

The effect is achieved also to a mask that includes dark lines in the bright field mask, such as Brick Wall pattern. The pattern shown in FIG. 36A shows the target pattern as black and the transmitting part as white. If the auxiliary pattern is inserted to Brick Wall pattern, it becomes the pattern as shown in FIG. 36B. The widths of the auxiliary pattern in X and Y directions is 65 nm×0.8=52 nm. In the same exposure condition, the half pitch in Y direction is $k_1$=0.45 using $k_1$. The illumination condition is the hexapole illumination as shown in FIG. 34 and is a=0.58, $2\alpha=2\tan^{-1}(1/1.5)=73.70°$. A size of a local light source is σr=0.10. The polarization is unpolarized light. The exposure result by the ArF excimer laser and the immersion exposure apparatus with a NA of 1.35 is shown. FIGS. 37A and 37B shows a two-dimension intensity distribution as the exposure result, and shows intensity with a predetermined intensity and a level contour line of ±20% to its intensity. FIG. 37A shows the result in best focus, and FIG. 37B shows the result in ±0.10 μm defocus. The contrast is good in best focus and defocus, the degradation in defocus is little, and the depth of focus of 0.2 μm or more is obtained.

Here, a description will be given of a special case that the ratio of Px and Py is Py=2Px. In this case, $2\alpha=2\tan^{-1}(2/1*2)=90°$, $2\alpha=90°$ are satisfied, two poles that do not exist on X axis among the hexapole overlap, and a quadrupole (cross pole) is formed. However, this is considered to be various hexapole. In other words, this is the quadrupole (cross pole) but generates the three beam interference.

Figure 38:
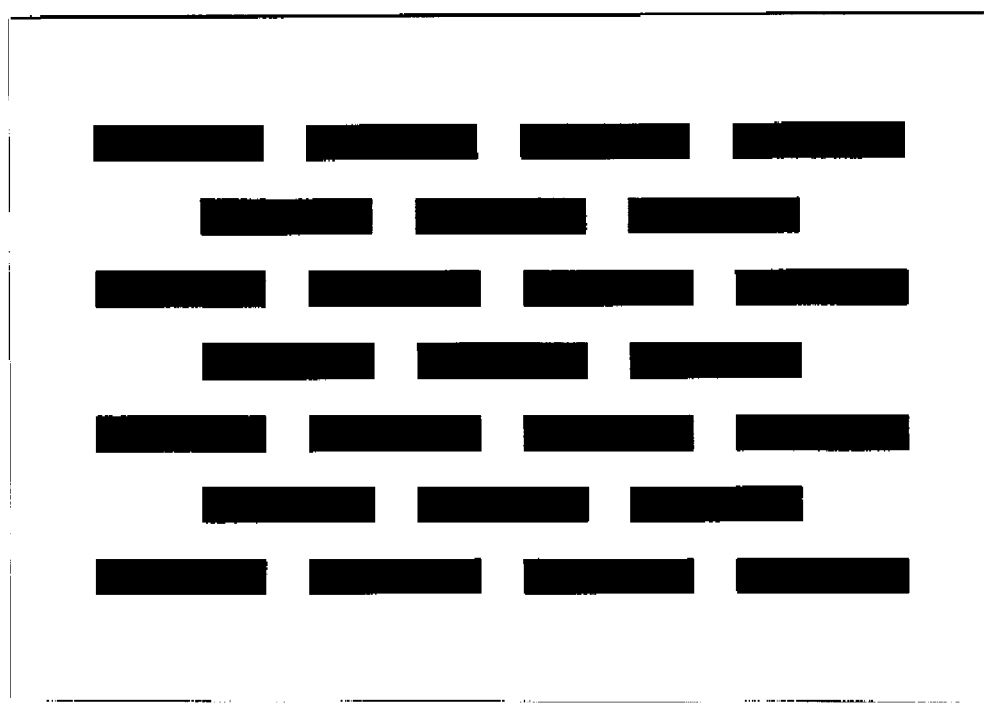
FIG. 38 is a schematic plane view of further another target pattern in a sixth embodiment.

Another example of Brick Wall pattern is shown. The pattern shown in FIG. 38 shows the target pattern as black and the transmitting part as white. The mask uses the attenuated phase shift mask, in the size of the contact hole, if the width in X direction is 260 nm, the width in Y direction is 65 nm and an interval of X and Y directions is 65 nm, the pitch is Px=325 nm and Py=130 nm. In the same exposure condition, the half pitch in Y direction of 65 nm is $k_1$=0.45 using $k_1$.

Figure 39:
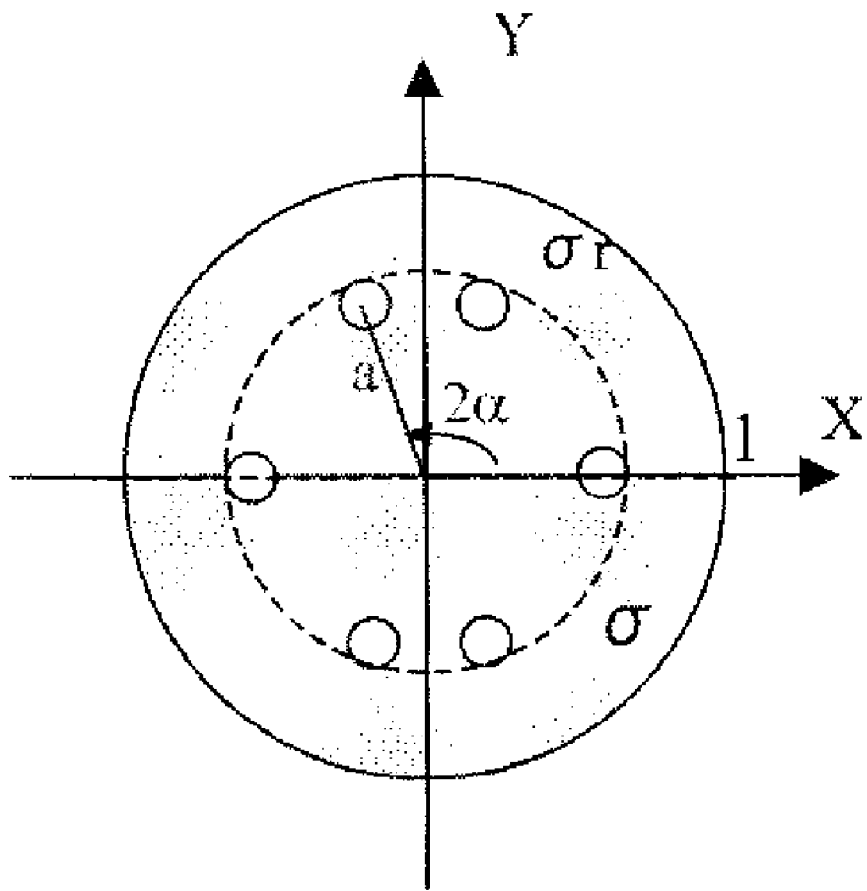
FIG. 39 is a schematic plane view of an effective light source shape to expose the mask pattern shown in FIG. 38.
Figure 40B:
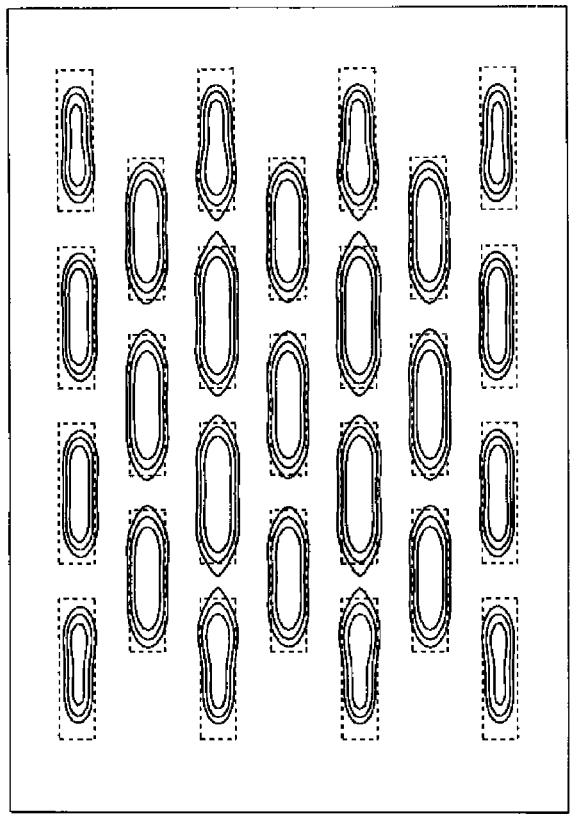
FIG. 40B is a view of an exposure result of the mask pattern shown in FIG. 38 at a defocus.
Figure 40A:
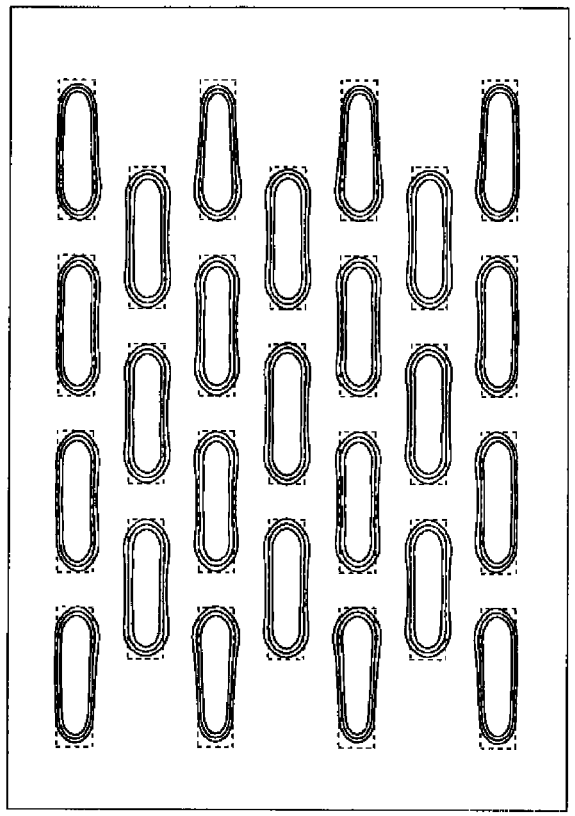
FIG. 40A is a view of an exposure result of the mask pattern shown in FIG. 38 at a best focus.

The illumination condition is the hexapole illumination as shown in FIG. 39 and is a=0.57, $2\alpha=2\tan^{-1}(2.5/2)=102.7°$. A size of a local light source is σr=0.10. The polarization is unpolarized light. The exposure result by the ArF excimer laser and the immersion exposure apparatus with a NA of 1.35 is shown. FIGS. 40A and 40B shows a two-dimension intensity distribution as the exposure result, and shows intensity with a predetermined intensity and a level contour line of ±20% to its intensity. FIG. 40A shows the result in best focus, and FIG. 40B shows the result in ±0.10 μm defocus. The contrast is good in best focus and defocus, the degradation in defocus is little, and the depth of focus of 0.2 μm or more is obtained.

Figure 41A:
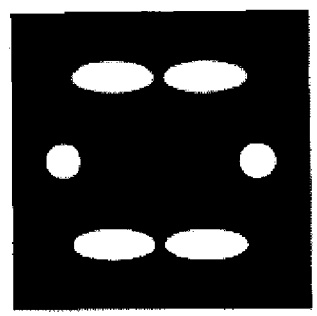
FIGS. 41A and 41B are schematic plane views of a conventional effective light source shape.

Mr. H. Kim (SPIE 2003_5040_23) executes an optimization of the illumination condition in Brick Wall pattern. This is a method that searches the optimal condition by computer simulation. The article discloses an illumination with an effective light source shape shown in FIG. 41A. However, the detail illumination condition is not known. This method cannot easily obtain the optimal solution of the illumination condition to the pattern with a certain pitch, and a general solution is not disclosed. Although the illumination in the article closely resembles the hexapole illumination, the distance from the pupil center in each light source of the hexapole is not the same and the incident angles of oblique incidence are not in agreement. The light source on X axis oblique incidence-illuminates the periodic pattern in X direction, and the light source that does not exist on X axis oblique incidence-illuminates the periodic pattern in Y direction. Moreover, since the light source of oblique incidence to resolve in Y direction is large, it becomes the illumination that emphasizes the resolution in Y direction.

Figure 41B:
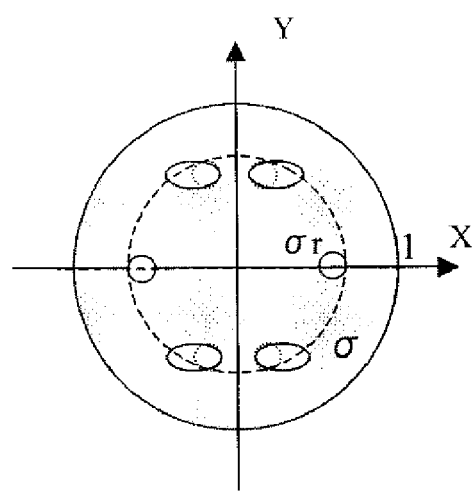
Figure 42B:
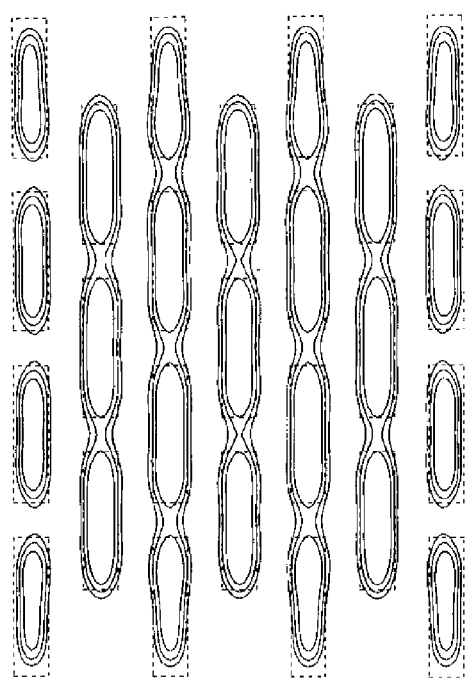
FIG. 42B is a view of an exposure result of the mask pattern shown in FIG. 38 at a defocus.
Figure 42A:
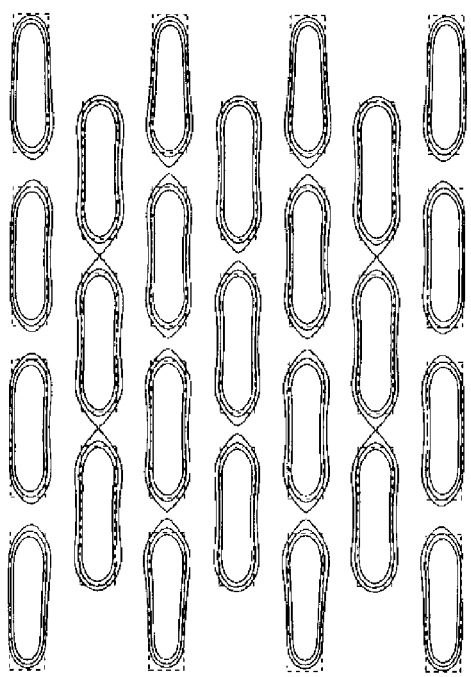
FIG. 42A is a view of an exposure result of the mask pattern shown in FIG. 38 at a best focus.

Here, a light source as shown in FIG. 41B is formed by lengthening the light source portion that does not exist on X axis to outside based on a=0.57 and $2\alpha=2\tan^{-1}(2.5/2)=102.7°$, and Brick Wall pattern as shown in FIG. 38 is resolved. FIGS. 42A and 42B shows a two-dimension intensity distribution as the exposure result. FIG. 42A shows the result in best focus, and FIG. 42B shows the result in ±0.10 μm defocus. Since the light source portion to be not on X axis lengthens to outside and the resolution of the periodic pattern in Y direction is emphasized, the edge of the line pattern in Y direction is sharp and has good contrast in best focus and defocus. However, the end of the line pattern in X direction cannot easily resolve and cannot resolve in defocus. Therefore, if the interval of the line pattern in X direction is further lengthened, the illumination as shown in FIG. 41B cannot resolve.

Thus, in the hexapole illumination as shown in FIG. 39, the distance from the pupil center in each light source of the hexapole is the same, and the illumination condition is optimized so that the image is formed by the three beam interference. Thereby, the image with good balance in X direction and Y direction and good symmetry is formed. Moreover, the degradation in defocus is little, and the practical depth of focus can be obtained to the fine pattern.

Figure 43:
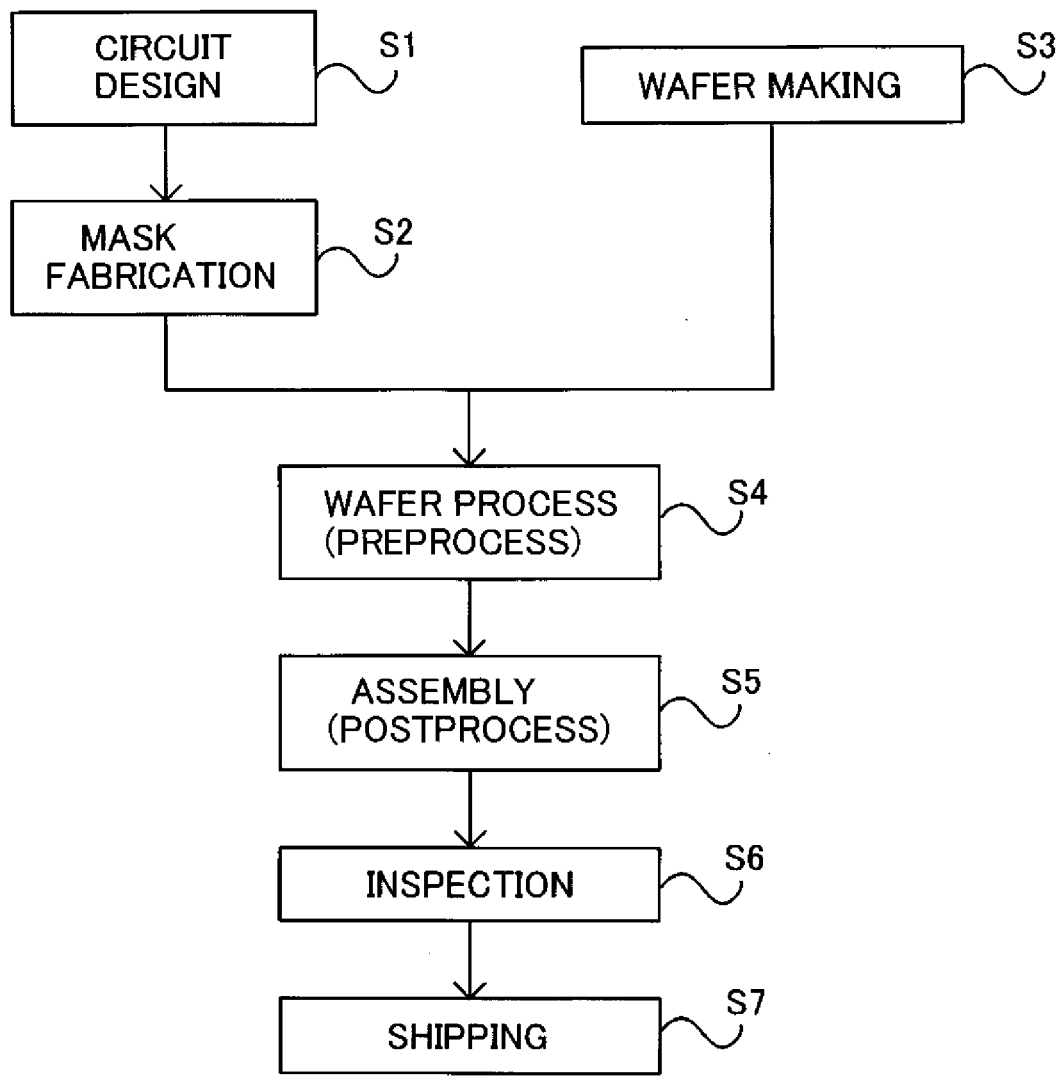
FIG. 43 is a flowchart for explaining a method for fabricating devices (semiconductor chips such as ICs, LSIs, and the like, LCDs, CCDs, etc.).
Figure 44:
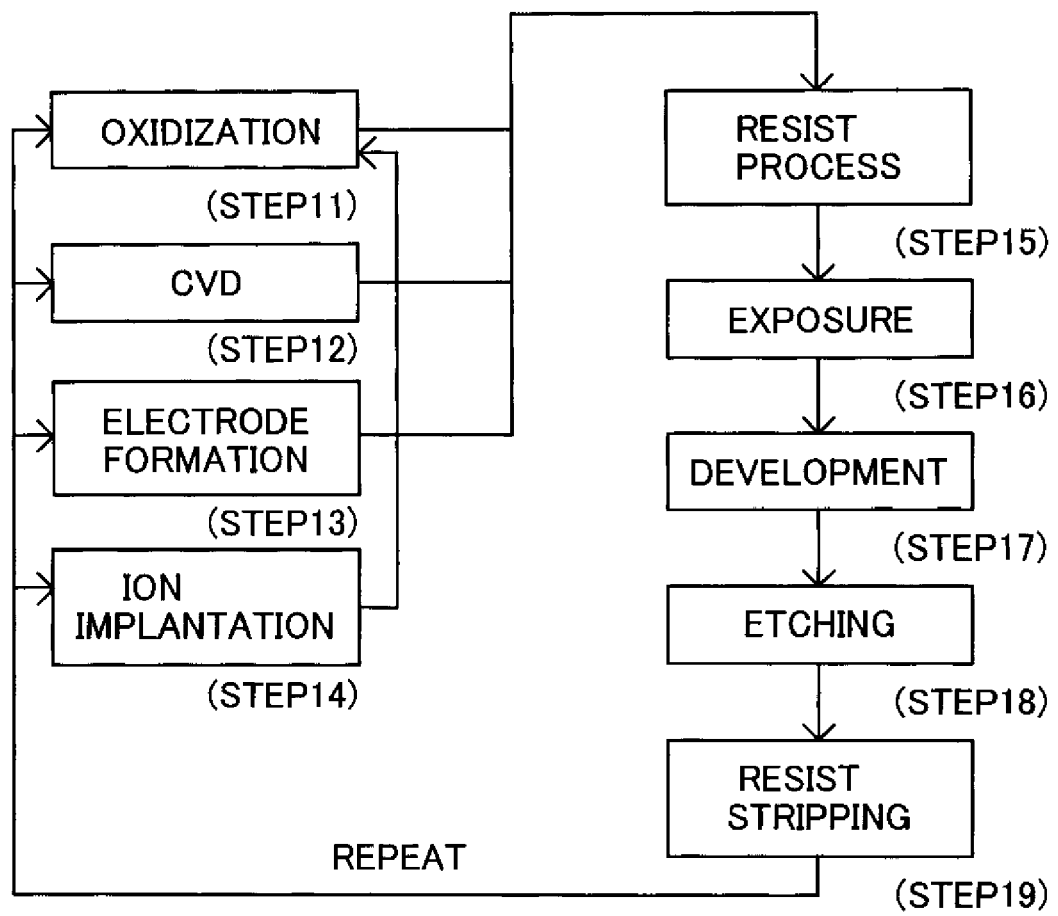
FIG. 44 is a detail flowchart of a wafer process in Step 4 of FIG. 43.

Referring now to FIGS. 43 and 44, a description will be given of an embodiment of a device fabrication method using the above mentioned exposure apparatus 100. FIG. 43 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 44 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Particularly, the fabrication method of this embodiment can stably resolve the fine contact hole, and provides the semiconductor device with high precision. Thus, the device fabrication method using the exposure apparatus 100, and resultant devices constitute one aspect of the present invention.

Thus, the image obtained by the three beam interference has good contrast and can obtain the large depth of focus to the fine pitch. The two beam interference cannot easily realize the contrast of 40% or more to finer half pitch. Although the four beam interference can obtain the contrast, the half pitch that can obtain the depth of focus of 0.3 μm or more is $0.5k_1$ or more. Therefore, the three beam interference is the practical and effective method to fine contact hole.

Furthermore, the present invention is not limited to these preferred embodiments and various variations and modifications may be made without departing from the scope of the present invention.

This application claims a foreign priority benefit based on Japanese Patent Application No. 2005-300662, filed on Oct. 14, 2005, which is hereby incorporated by reference herein in its entirety as if fully set forth herein.

What is claimed is:

1. An exposure method comprising the steps of:
   illuminating a mask that has a contact hole pattern using an illumination light; and
   projecting, via a projection optical system, the contact hole pattern onto a substrate to be exposed,
   wherein said contact hole pattern is a checker pattern that includes a plurality of periodic patterns, each of which has plural contact holes arranged in a first direction at a first pitch, and the plurality of periodic patterns are arranged in a second direction perpendicular to the first direction at a second pitch while shifting by half a pitch,
   wherein three beams among diffracted lights from the contact hole pattern interfere with each other,
   wherein said mask is an attenuated phase shift mask, and
   wherein said illumination light forms a radial polarization illumination and a hexapole illumination.

2. An exposure method comprising the steps of:
   illuminating a mask that has a contact hole pattern using an illumination light; and
   projecting, via a projection optical system, the contact hole pattern onto a substrate to be exposed,
   wherein said contact hole pattern is a checker pattern that includes a plurality of periodic patterns, each of which has plural contact holes arranged in a first direction at a first pitch, and the plurality of periodic patterns are arranged in a second direction perpendicular to the first direction at a second pitch while shifting by half a pitch,
   wherein three beams among diffracted lights from the contact hole pattern interfere with each other,
   wherein said mask is a binary mask, and
   wherein said illumination light forms a tangential polarization illumination or unpolarized illumination and a hexapole illumination.

* * * * *